(12) United States Patent
Kim et al.

(10) Patent No.: US 12,438,059 B2
(45) Date of Patent: Oct. 7, 2025

(54) SEMICONDUCTOR PACKAGE

(71) Applicant: Samsung Electronics Co., Ltd., Suwon-si (KR)

(72) Inventors: Namhoon Kim, Gunpo-si (KR); Kwangyoul Lee, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 465 days.

(21) Appl. No.: 17/847,130

(22) Filed: Jun. 22, 2022

(65) Prior Publication Data

US 2023/0117654 A1 Apr. 20, 2023

(30) Foreign Application Priority Data

Oct. 18, 2021 (KR) .......................... 10-2021-0138842

(51) Int. Cl.
| | |
|---|---|
| *H01L 23/16* | (2006.01) |
| *H01L 25/00* | (2006.01) |
| *H01L 25/065* | (2023.01) |

(52) U.S. Cl.
CPC .......... *H01L 23/16* (2013.01); *H01L 25/0657* (2013.01); *H01L 25/50* (2013.01); *H01L 2225/06513* (2013.01); *H01L 2225/06541* (2013.01); *H01L 2225/06586* (2013.01)

(58) Field of Classification Search
CPC ..... H01L 23/16; H01L 25/0657; H01L 25/50; H01L 2225/06513; H01L 2225/06541; H01L 2225/06586
See application file for complete search history.

(56) References Cited

U.S. PATENT DOCUMENTS

| | | |
|---|---|---|
| 7,118,940 B1 | 10/2006 | Myers et al. |
| 7,737,563 B2 | 6/2010 | Su et al. |
| 9,165,916 B2 | 10/2015 | Chung et al. |
| 10,658,300 B2 | 5/2020 | Kim et al. |
| 2010/0190294 A1 | 7/2010 | Simmons-Matthews |
| 2011/0097847 A1 | 4/2011 | Lake |
| 2019/0326245 A1 | 10/2019 | Baello et al. |
| 2021/0272880 A1* | 9/2021 | Lee ..................... H01L 23/3128 |
| 2021/0366802 A1* | 11/2021 | Huang .................. H01L 25/167 |

FOREIGN PATENT DOCUMENTS

KR 10-2021-0051535 A 5/2021

OTHER PUBLICATIONS

First Office Action issued Aug. 11, 2025 in Korean Application No. 10-2021-138842.

\* cited by examiner

*Primary Examiner* — Jay C Kim
*Assistant Examiner* — Woo K Lee
(74) *Attorney, Agent, or Firm* — Harness, Dickey & Pierce, P.L.C.

(57) ABSTRACT

A semiconductor package includes a first semiconductor chip; a lower dam structure disposed on an edge of a top surface of the first semiconductor substrate; a second semiconductor chip, which is mounted on the first semiconductor chip; an upper dam structure disposed on an edge of the bottom surface of the second semiconductor substrate; a chip connecting terminal disposed between the first semiconductor chip and the second semiconductor chip and connecting the first semiconductor chip to the second semiconductor chip; and an adhesive layer disposed between the first semiconductor chip and the second semiconductor chip and surrounding the chip connecting terminal.

20 Claims, 19 Drawing Sheets

SEMICONDUCTOR PACKAGE

CROSS-REFERENCE TO RELATED APPLICATION

This application is based on and claims priority under 35 U.S.C. § 119 to Korean Patent Application No. 10-2021-0138842, filed on Oct. 18, 2021, in the Korean Intellectual Property Office, the disclosure of which is incorporated by reference herein in its entirety.

BACKGROUND

The inventive concepts relate to a semiconductor package, and more particularly, to a semiconductor package including a plurality of semiconductor chips stacked in a vertical direction.

The storage capacity of semiconductor chips is increasing and, at the same time, semiconductor packages including semiconductor chips are demanded to be thin and light. Also, research is being conducted to include semiconductor chips of various functions in a semiconductor package and to quickly drive the semiconductor chips. Also, research for improving the structural reliability of a semiconductor package is being actively conducted.

SUMMARY

The inventive concepts provide a semiconductor package with improved structural reliability.

According to an aspect of the inventive concepts, there is provided a semiconductor package including a first semiconductor chip including a first semiconductor substrate having a first active layer, at least one first via electrode connected to the first active layer and penetrating through at least a portion of the first semiconductor substrate in a vertical direction, at least one first lower chip pad on a bottom surface of the first semiconductor substrate, and at least one first upper chip pad on a top surface of the first semiconductor substrate and connected to the first via electrode; a lower dam structure on an edge of the top surface of the first semiconductor substrate; a second semiconductor chip is mounted to the first semiconductor chip, the second semiconductor chip including a second semiconductor substrate having a second active layer; and a second lower chip pad disposed on a bottom surface of the second semiconductor substrate, at least one upper dam structure on an edge of the bottom surface of the second semiconductor substrate; at least one chip connecting terminal electrically connecting the at least one first upper chip pad of the first semiconductor chip and the at least one second lower chip pad of the second semiconductor chip; and an adhesive layer between the first semiconductor chip and the second semiconductor chip, the adhesive layer surrounding the at least one first upper chip pad, the at least one second lower chip pad, and the at least one chip connecting terminal.

According to an aspect of the inventive concepts, there is provided a semiconductor package including a first semiconductor chip comprising a first semiconductor substrate having a first active layer, at least one first via electrode connected to the first active layer and penetrating through at least a portion of the first semiconductor substrate in a vertical direction; at least one first lower chip pad on a bottom surface of the first semiconductor substrate; and at least one first upper chip pad on a top surface of the first semiconductor substrate and connected to the at least one first via electrode; a lower dam structure on an edge of the top surface of the first semiconductor substrate and comprising a plurality of lower dam protrusions spaced apart from one another; a second semiconductor chip mounted to the first semiconductor chip, the second semiconductor chip comprising a second semiconductor substrate having a second active layer, and at least one second lower chip pad on a bottom surface of the second semiconductor substrate; an upper dam structure on an edge of the bottom surface of the second semiconductor substrate and comprising a plurality of upper dam protrusions spaced apart from one another; at least one chip connecting terminal electrically connecting the at least one first upper chip pad of the first semiconductor chip and the at least one second lower chip pad of the second semiconductor chip; and an adhesive layer between the first semiconductor chip and the second semiconductor chip, the adhesive layer surrounding the at least one first upper chip pad, the at least one second lower chip pad, and at least one the chip connecting terminal.

According to an aspect of the inventive concepts, there is provided a semiconductor package including a package substrate; a first semiconductor chip mounted to the package substrate, the first semiconductor chip comprising a first semiconductor substrate having a first active layer, at least one first via electrode connected to the first active layer and penetrating through at least a portion of the first semiconductor substrate in a vertical direction, at least one first lower chip pad on a bottom surface of the first semiconductor substrate, and at least one first upper chip pad on a top surface of the first semiconductor substrate and connected to the at least one first via electrode; at least one package connection terminal between the package substrate and the at least one first lower chip pad of the first semiconductor chip; an underfill layer between the package substrate and the first semiconductor chip and surrounding the at least one package connection terminal; a lower dam structure on an edge of the top surface of the first semiconductor substrate; a second semiconductor chip mounted to the first semiconductor chip, the second semiconductor chip comprising a second semiconductor substrate having a second active layer, and at least one second lower chip pad on a bottom surface of the second semiconductor substrate; an upper dam structure on an edge of the bottom surface of the second semiconductor substrate; at least one chip connecting terminal electrically connecting the at least one first upper chip pad of the first semiconductor chip and the at least one second lower chip pad of the second semiconductor chip; an adhesive layer between the first semiconductor chip and the second semiconductor chip and surrounding the at least one first upper chip pad, the at least one second lower chip pad, and the at least one chip connecting terminal; and a molding layer on the package substrate and surrounding the first semiconductor chip, the second semiconductor chip, and the adhesive layer.

Since a semiconductor package according to some example embodiments of the inventive concepts may include a lower dam structure on the top surface of a first semiconductor chip and an upper dam structure on the bottom surface of a second semiconductor chip, the second semiconductor chip may be prevented from being tilted in an operation of mounting the second semiconductor chip on the first semiconductor chip.

Also, since a semiconductor package according to some example embodiments of the inventive concepts may include a lower dam structure and an upper dam structure, a short problem (or short circuit problem) between a plurality of chip connecting terminals may be prevented in an operation of mounting a second semiconductor chip on a first semiconductor chip.

Also, since a semiconductor package according to some example embodiments of the inventive concepts may include a lower dam structure and an upper dam structure, in an operation of mounting a second semiconductor chip on a first semiconductor chip, an adhesive layer may be disposed between a corner portion of the top surface of the first semiconductor chip and a corner portion of the bottom surface of the second semiconductor chip. Therefore, the adhesion between the first semiconductor chip and the second semiconductor chip may be improved, and thus the structural reliability of a semiconductor package may be improved.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

In the following description, when the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
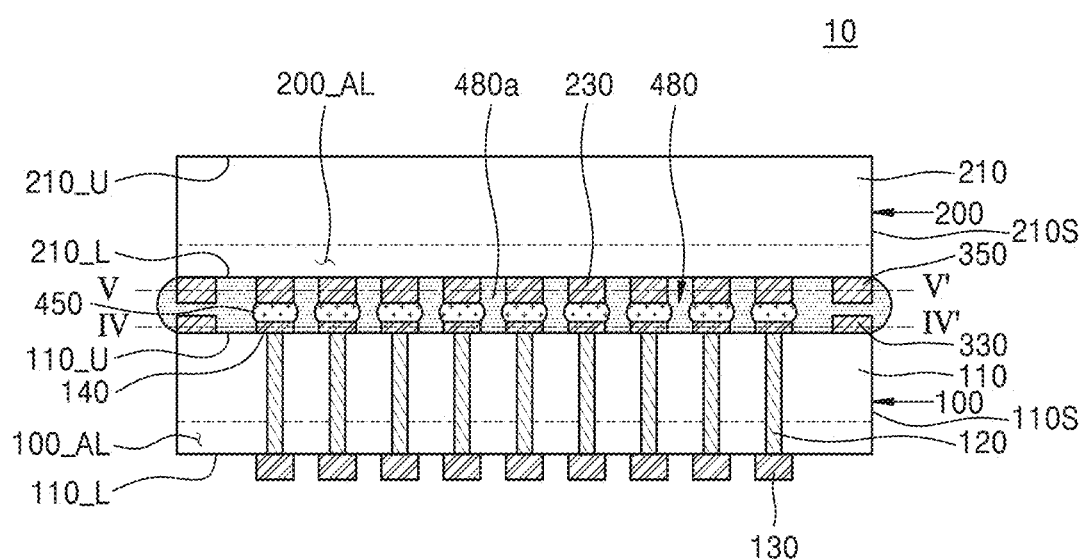
FIG. 1 is a cross-sectional view of a semiconductor package according to according to some example embodiments of the inventive concepts.
Figure 2:
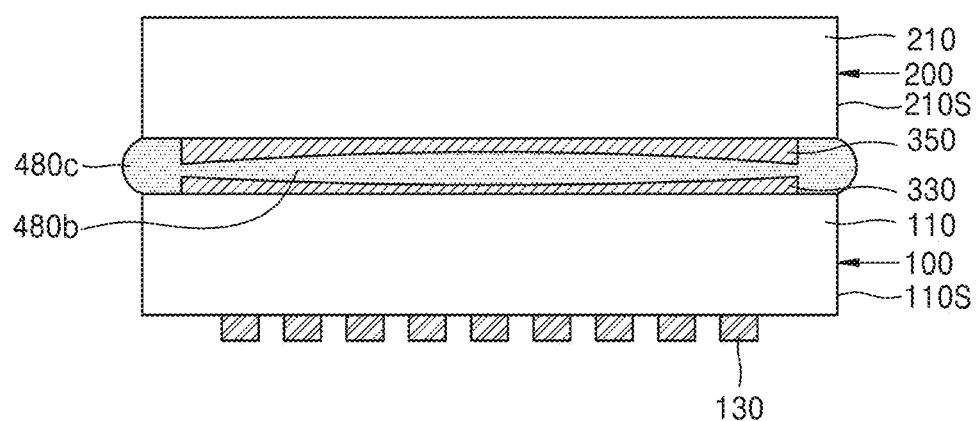
FIG. 2 is a side view of a semiconductor package according to according to some example embodiments of the inventive concepts.
Figure 3:
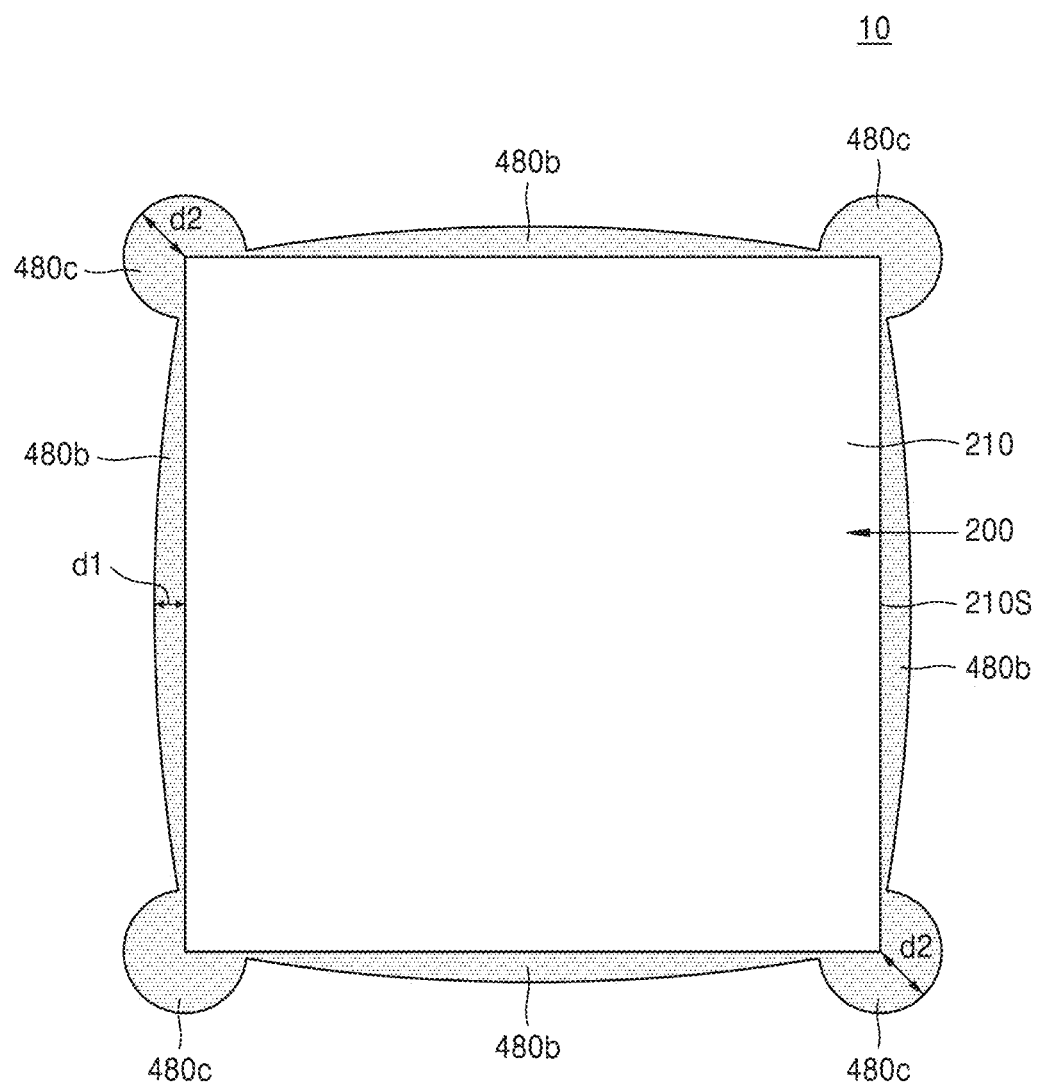
FIG. 3 is a plan view of a semiconductor package according to according to some example embodiments of the inventive concepts.

FIG. 1 is a cross-sectional view of a semiconductor package 10 according to according to some example embodiments of the inventive concepts. FIG. 2 is a side view of the semiconductor package 10 according to according to some example embodiments of the inventive concepts. FIG. 3 is a plan view of the semiconductor package 10 according to some example embodiments of the inventive concepts.

Referring to FIGS. 1 to 3, the semiconductor package 10 may include a first semiconductor chip 100, a second semiconductor chip 200, a lower dam structure 330, an upper dam structure 350, a chip connecting terminal 450, and an adhesive layer 480.

The first semiconductor chip 100 may include a first semiconductor substrate 110 having a first active layer 100_AL, at least one first via electrode 120, at least one first lower chip pad 130, and at least one first upper chip pad 140.

In some example embodiments, the first semiconductor chip 100 may be and/or include a memory chip. For example, the memory chip may include a volatile memory semiconductor chip (like dynamic random access memory (DRAM), static random access memory (SRAM), and/or the like) and/or may include a non-volatile memory chip (like phase-change random access memory (PRAM), magneto-resistive random access memory (MRAM), ferroelectric random access memory (FeRAM), and/or resistive random access memory (RRAM), and/or the like).

However, the example embodiments are not limited thereto, and the first semiconductor chip 100 may be and/or include a logic semiconductor chip. The logic semiconductor chip may include, for example, a logic semiconductor chip like a central processor unit (CPU), a micro processor unit (MPU), a graphics processor unit (GPU), an application processor (AP), and/or the like.

The material constituting the first semiconductor substrate 110 of the first semiconductor chip 100 may include a semiconductor (e.g., an elemental semiconductor like silicon (Si), germanium (Ge), and/or the like, and/or a compound semiconductor like silicon carbide (SiC), gallium arsenide (GaAs), indium arsenide (InAs), indium phosphide (InP), and/or the like). However, the material and/or materials constituting the first semiconductor substrate 110 are not limited thereto.

In some example embodiment, the first semiconductor substrate 110 may include the first active layer 100_AL in a lower portion thereof. The first active layer 100_AL may include a plurality of individual devices of various types. For example, the individual devices may include various microelectronic devices, e.g., a complementary metal-oxide semiconductor (CMOS) transistor, a metal-oxide-semiconductor field effect transistor (MOSFET), a system large scale integration (LSI), an image sensor like a CMOS imaging sensor (CIS), a micro-electro-mechanical system (MEMS), an active device, a passive device, etc.

Also, the first semiconductor substrate 110 may have a top surface 110_U and a bottom surface 110_L. For example, the top surface 110_U of the first semiconductor substrate 110 may be one surface of the first semiconductor substrate 110 on which the at least one first upper chip pad 140 and the lower dam structure 330 are arranged, and the bottom surface 110_L of the first semiconductor substrate 110 may be one surface of the first semiconductor substrate 110 on which the at least one first lower chip pad 130 and/or the first active layer 100_AL are disposed.

Herein, a horizontal direction may be defined as a direction parallel to a direction in which the top surface 110_U and the bottom surface 110_L of the first semiconductor substrate 110 extend, and a vertical direction may be defined as a direction perpendicular to a direction in which the top surface 110_U and the bottom surface 110_L of the first semiconductor substrate 110 extend. The spatially relative terms (e.g., top, bottom, side, lower, upper, vertical, horizontal, etc.) are used for ease of description to describe one element or feature's relationship to another element(s) or feature(s) as illustrated in the figures. However, it will be understood that these spatially relative terms are intended to encompass different orientations of the device in use or operation in addition to the orientation depicted in the figures. For example, the device may be otherwise oriented (rotated 90 degrees or at other orientations) and the spatially relative descriptors used herein interpreted accordingly.

The at least one first via electrode 120 of the first semiconductor chip 100 may pass through at least a portion of the first semiconductor substrate 110 in the vertical direction and may be electrically connected to the plurality of individual devices in the first active layer 100_AL.

For example, the first via electrode 120 may penetrate through the top surface 110_U and the bottom surface 110_L of the first semiconductor substrate 110 in the vertical direction to connect the first upper chip pad 140 to the first lower chip pad 130 and/or may penetrate through only a portion of the first semiconductor substrate 110 in the vertical direction to connect the first upper chip pad 140 to a plurality of individual devices in the first active layer 100_AL.

In some example embodiments, the at least one first via electrode 120 may include a conductive plug (not shown) and a conductive barrier layer (not shown). The conductive plug may penetrate through at least a portion of the first semiconductor substrate 110, and the conductive barrier layer may surround the sidewall of the conductive plug. For example, the conductive plug may have a cylindrical and/or shape, and the conductive barrier layer may have a cylindrical and/or tubular shape surrounding the sidewall of the conductive plug. In some example embodiments, the conductive plug may include a conductive material like a metal and/or metalloid, and/or the conductive barrier layer may include an insulating material like an oxide (e.g., SiO$_x$, GeO$_x$, MgO, Al$_y$O$_x$, and/or the like) and/or the like.

The first lower chip pad 130 of the first semiconductor chip 100 may be disposed on the bottom surface 110_L of the first semiconductor substrate 110 and electrically connected to the plurality of individual devices in the first active layer 100_AL. Also, the first lower chip pad 130 may be electrically connected to the first via electrode 120.

In some example embodiments, the length (e.g. the height) of the at least one first lower chip pad 130 in the vertical direction may be greater than the length (e.g., the height) of the at least one first upper chip pad 140 in the vertical direction. In some example embodiments, the length of the at least one first lower chip pad 130 in the vertical direction may be from about 10 micrometers to about 100 micrometers. However, the length of at least one the first lower chip pad 130 in the vertical direction is not limited to the numerical values stated above.

In some example embodiments, the first semiconductor chip 100 may further include a first passivation layer (not shown) on the bottom surface 110_L of the first semiconductor substrate 110 The first passivation layer may, for example, surround the side surfaces of the at least one first lower chip pad 130, and may include an insulation material. The first passivation layer may expose the bottom surface of the at least one first lower chip pad 130.

The at least one first upper chip pad 140 of the first semiconductor chip 100 may be disposed on the top surface 110_U of the first semiconductor substrate 110 and contact the at least one first via electrode 120. Also, the at least one first upper chip pad 140 may be and/or include a conductive material pad on which the chip connecting terminal 450 to be described later is mounted.

In some example embodiments, the at least one first lower chip pad 130, the at least one first via electrode 120, and/or the at least one first upper chip pad 140 may include a metal and/or a metalloid. For example, the at least one first lower chip pad 130, the at least one first via electrode 120, and/or the at least one first upper chip pad 140 may include at least one of copper (Cu), nickel (Ni), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), an alloy thereof, and/or the like.

The lower dam structure 330 may be disposed at an edge of the top surface 110_U of the first semiconductor substrate 110. In some example embodiments, the lower dam structure 330 may include a plurality of lower dam structures 330. For example, when the semiconductor package 10 is viewed from above (e.g., from a plan view), the first semiconductor substrate 110 may have a rectangular shape having four sidewalls 110S, and the plurality of lower dam structures 330 may be arranged at edges of the top surface 110_U of the first semiconductor substrate 110 to be adjacent to the sidewalls 110S thereof, respectively.

The arrangement of the lower dam structure 330 will be described in more detail with reference to FIG. 4.

In some example embodiments, the lower dam structure 330 may include a metal, such as at least one of copper (Cu), nickel (Ni), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), an alloy thereof, and/or the like.

In some example embodiments, the material constituting the lower dam structure 330 may be substantially the same as the material constituting the first upper chip pad 140. For example, in some example embodiments the lower dam structure 330 and the first upper chip pad 140 may include copper (Cu).

Also, in some example embodiments, the lower dam structure 330 may include at least one of a photo imageable dielectric (PID) material and/or a photosensitive polyimide (PSPI).

In some example embodiments, the length of the lower dam structure 330 in the vertical direction (e.g., the height of the lower dam structure 330) may be greater than the length of the first upper chip pad 140 in the vertical direction (e.g., the height of the first upper chip pad 140). In some example embodiments, the length of the lower dam structure 330 in the vertical direction may be from about 3 micrometers to about 50 micrometers.

The lower dam structure 330 may include a length in a first horizontal direction and a width in a second horizontal direction. The length may correspond to the horizontal direction in which the lower dam structure 330 extends and may be, for example, longer than the width. In some example embodiments, the length of the lower dam structure 330 may be less than the length of the sidewall 110S of the first semiconductor substrate 110 in the corresponding horizontal direction. In some example embodiments, the outer surface of the lower dam structure 330 may be on the same plane as (e.g., planar to) the sidewall 110S of the first semiconductor substrate 110.

The second semiconductor chip 200 may be a semiconductor chip mounted on the first semiconductor chip 100. In some example embodiments, the second semiconductor chip 200 may include a second semiconductor substrate 210, which includes a second active layer 200_AL, and at least one second lower chip pad 230. The second semiconductor chip 200 may be and/or include a memory chip and/or a logic chip. For example, in some example embodiments, the second semiconductor chip 200 may be substantially similar to the first semiconductor chip 100. Hereinafter, identical descriptions between the first semiconductor chip 100 and the second semiconductor chip 200 will be omitted, and differences therebetween will be focused on.

In some example embodiments, the first semiconductor chip 100 and the second semiconductor chip 200 may be and/or include semiconductor chips of different types. For example, at least one of the first or second semiconductor chips 100 and 200 may be a logic chip, and at least one of the remainder may be a memory chip. Therefore, the semiconductor package 10 may be a system in package (SIP) in which a plurality of different types of semiconductor chips (e.g., the first and second semiconductor chips 100 and 200) are electrically connected to each other and operated as one system. However, the example embodiments are not limited thereto, and in some example embodiments the first semiconductor chip 100 and the second semiconductor chip 200 may be semiconductor chips of the same type.

In some example embodiments, the second semiconductor chip 200 may include a memory semiconductor chip. However, the example embodiments are not limited thereto, and the second semiconductor chip 200 may include a logic semiconductor chip.

In some example embodiments, the second semiconductor substrate 210 may include the second active layer 200_AL in a lower portion thereof. The second active layer 200_AL may include a plurality of individual devices of various types.

Also, the second semiconductor substrate 210 may have a top surface 210_U and a bottom surface 210_L. For example, the bottom surface 210_L of the second semiconductor substrate 210 may be one surface of the second semiconductor substrate 210 on which the at least one second lower chip pad 230 is disposed.

For example, the at least one second lower chip pad 230 of the second semiconductor chip 200 may be disposed on the bottom surface 210_L of the second semiconductor substrate 210 and electrically connected to the individual devices in the second active layer 200_AL.

In some example embodiments, the length of the second lower chip pad 230 in the vertical direction (e.g., the height) may be from about 10 micrometers to about 100 micrometers. However, the length of the second lower chip pad 230 in the vertical direction is not limited to the numerical values stated above.

In some example embodiments, the second semiconductor chip 200 may further include a second passivation layer (not shown). The second passive layer may be on the bottom surface 210_L of the second semiconductor chip 200 and may surround the side surfaces of the second lower chip pad 230. The second passive layer may be and/or include an insulation material. The second passivation layer may expose the bottom surface of the second lower chip pad 230.

In an example embodiment, the at least one second lower chip pad 230 may include a metal and/or metalloid. For example, the at least one second lower chip pad 230 may include at least one of copper (Cu), nickel (Ni), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), an alloy thereof, and/or the like.

The upper dam structure 350 may be disposed at an edge of the bottom surface 210_L of the second semiconductor substrate 210. In some example embodiment, the upper dam structure 350 may include a plurality of upper dam structures 350. For example, when the semiconductor package 10 is viewed from above, the second semiconductor substrate 210 may have a rectangular shape having four sidewalls 210S, and the plurality of upper dam structures 350 may be arranged at edges of the bottom surface 210_L of the second semiconductor substrate 210 to be adjacent to the sidewalls 210S thereof, respectively.

In some example embodiments, the upper dam structures 350 may be arranged to overlap the lower dam structures 330 in the vertical direction. The arrangement of the upper dam structures 350 will be described in more detail with reference to FIG. 5.

In some example embodiments, the material constituting the upper dam structure 350 may include a metal like at least one of copper (Cu), nickel (Ni), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), an alloy thereof, and/or the like.

In some example embodiments, the material constituting the upper dam structure 350 may be substantially the same as the material constituting the at least one second lower chip pad 230. For example, the upper dam structure 350 and the second lower chip pad 230 may include copper (Cu).

Also, in some example embodiments, the upper dam structure 350 may include at least one of a PID material and/or a PSPI.

In some example embodiments, the length of the upper dam structure 350 in the vertical direction (e.g., the height of the upper dam structure 350) may be substantially the same as the length of the at least one second lower chip pad 230 in the vertical direction (e.g., the height of the at least one second lower chip pad 230). For example, the length of the upper dam structure 350 in the vertical direction may be from about 10 micrometers to about 100 micrometers.

In some example embodiments, the upper dam structure 350 may be simultaneously formed with the second lower chip pad 230. For example, the upper dam structure 350 may be simultaneously formed with the second lower chip pad 230 through a photolithography process and a plating process. Therefore, the material constituting the upper dam structure 350 and the second lower chip pad 230 and the height thereof may be substantially the same.

Also, in some example embodiment, the height of the upper dam structure 350 may be greater than the height of the lower dam structure 330. For example, when the height of the lower dam structure 330 is from about 3 micrometers to about 50 micrometers, the height of the upper dam structure 350 may be greater than the length of the lower dam structure 330 in the vertical direction within the range from about 10 micrometers to about 100 micrometers.

The upper dam structure may include a length in a first horizontal direction and a width in a second horizontal direction. The length may correspond to the horizontal direction in which the lower dam structure 330 extends and may be, for example, longer than the width. In some example embodiments, the length of the upper dam structure 350 in the horizontal direction may be less than the corresponding length of the sidewall 210S of the second semiconductor substrate 210 in the horizontal direction. In some example embodiments, the outer surface of the upper dam structure 350 may be on the same plane as (e.g., planar to) the sidewall 210S of the second semiconductor substrate 210.

The at least one chip connecting terminal 450 of the semiconductor package 10 may be provided between the at least one first upper chip pad 140 of the first semiconductor chip 100 and the at least one second lower chip pad 230 of the second semiconductor chip 200, thereby electrically connecting the first semiconductor chip 100 to the second semiconductor chip 200.

In some example embodiments, the chip connecting terminal 450 may include a conductive material, and may be and/or include a solder ball and/or pillar containing a metal material including, e.g., at least one of tin (Sn), silver (Ag), copper (Cu), aluminum (Al), an alloy thereof, and/or the like. The metal material may be, for example, a eutectic alloy.

The adhesive layer 480 of the semiconductor package 10 may be disposed between the first semiconductor chip 100 and the second semiconductor chip 200 and surround the at least one first upper chip pad 140, the at least one second lower chip pad 230, and the at least one chip connecting terminal 450.

In some example embodiments, the adhesive layer 480 may include at least any one of a non-conductive film (NCF), a non-conductive paste (NCP), an insulation polymer, an epoxy resin, and/or the like.

In some example embodiments, the adhesive layer 480 may include a first adhesive portion 480a, which is disposed between the first semiconductor chip 100 and the second semiconductor chip 200 and overlaps the first semiconductor chip 100 and the second semiconductor chip 200 in the vertical direction (e.g., in a plan view), a second adhesive portion 480b, which is disposed between edges of the first semiconductor chip 100 and edges of the second semiconductor chip 200 and protrudes from the sidewalls 110S of the first semiconductor chip 100 and the sidewalls 210S of the second semiconductor chip 200 by a first protruding distance d1, and a third adhesive portion 480c, which is disposed between corners of the first semiconductor chip 100 and corners of the second semiconductor chip 200 and protrudes from vertices formed by the sidewalls 110S of the first semiconductor chip 100 and vertices formed by the sidewalls 210S of the second semiconductor chip 200 by a second protruding distance d2 that is greater than the first protruding distance d1.

The first to third adhesive portions 480a, 480b, and 480c of the adhesive layer 480 will be described below in detail with reference to FIGS. 4 and 5.

Figure 4:
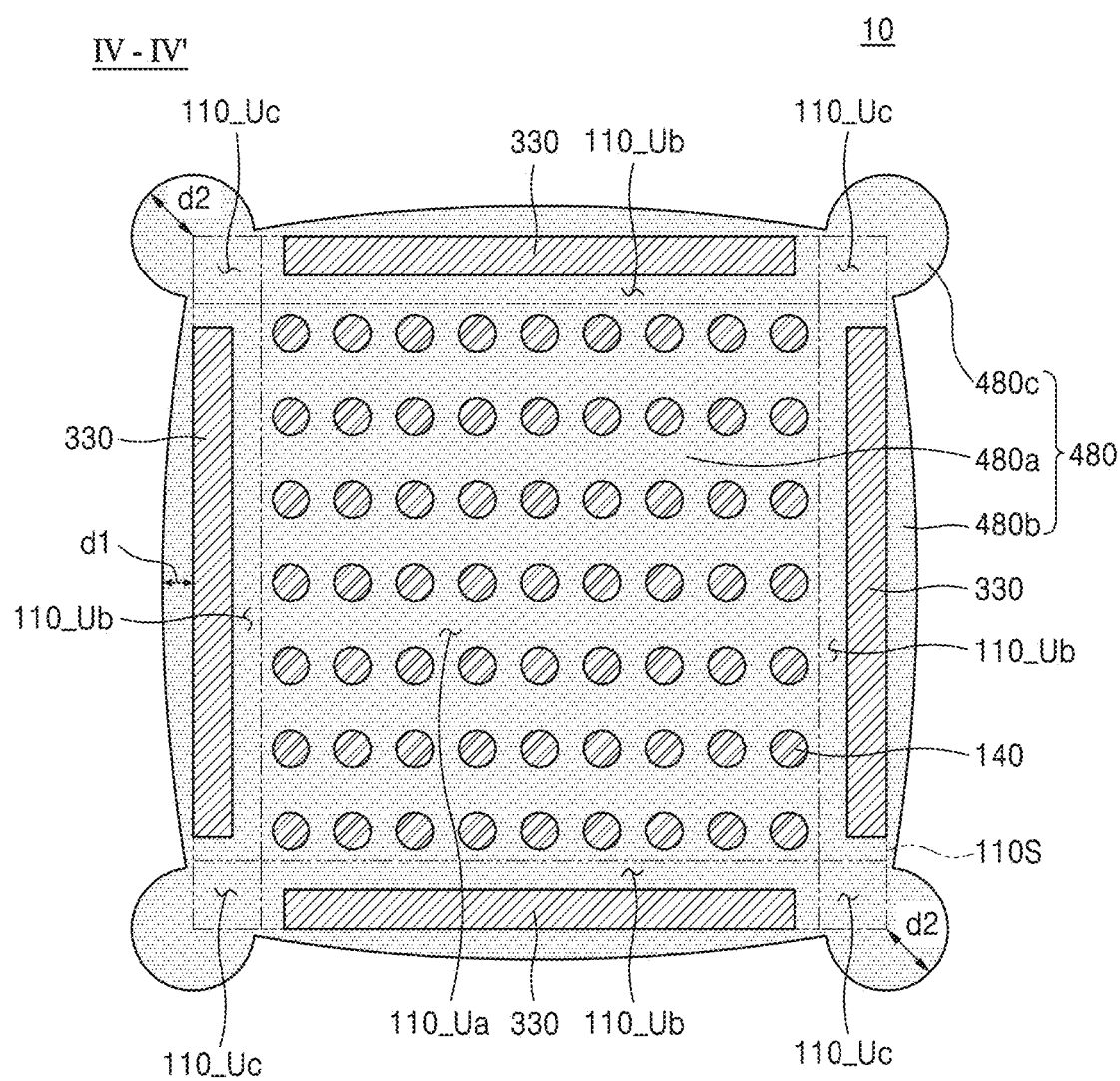
FIG. 4 is a cross-sectional view of a region taken along a line IV-IV' of FIG. 1.

FIG. 4 is a cross-sectional view of a region taken along a line IV-IV' of FIG. 1.

Referring to FIG. 4, the top surface 110_U of the first semiconductor substrate 110 may include a first center portion 110_Ua, a first edge portion 110_Ub, and a first corner portion 110_Uc.

The first center portion 110_Ua of the top surface 110_U of the first semiconductor substrate 110 may be a portion of the top surface 110_U of the first semiconductor substrate 110 on which the at least one first upper chip pad 140 is disposed. The first edge portion 110_Ub of the top surface 110_U of the first semiconductor substrate 110 is provided outside the first center portion 110_Ua and may be a portion of the top surface 110_U of the first semiconductor substrate 110 on which the lower dam structure 330 is disposed. Also, the first corner portion 110_Uc of the top surface 110_U of the first semiconductor substrate 110 is provided outside the first center portion 110_Ua and may be a portion of the top surface 110_U of the first semiconductor substrate 110 adjacent to vertices formed by the sidewalls 110S of the first semiconductor substrate 110.

In some example embodiments, the first adhesive portion 480a of the adhesive layer 480 may be disposed on the first center portion 110_Ua of the first semiconductor substrate 110 and surround the first upper chip pad 140.

In some example embodiments, the second adhesive portion 480b of the adhesive layer 480 may be disposed on the first edge portion 110_Ub of the first semiconductor substrate 110 and surround the lower dam structure 330. Also, portions of the second adhesive portion 480b may protrude by the first protruding distance d1 from the sidewalls 110S of the first semiconductor chip 100.

Also, when the semiconductor package 10 is viewed from above (e.g., in a plan view), the portions of the second adhesive portion 480b protruding from the sidewalls 110S of the first semiconductor chip 100 may each have a semi-elliptical shape. However, the shape of the second adhesive portion 480b is not limited thereto.

In some example embodiments, the third adhesive portion 480c of the adhesive layer 480 may be disposed on the first corner portion 110_Uc of the first semiconductor substrate 110. Also, portions of the third adhesive portion 480c may protrude from vertices formed by the sidewalls 110S of the first semiconductor chip 100 by the second protruding distance d2 that is greater than the first protruding distance d1.

Also, when the semiconductor package 10 is viewed from above (e.g., in a plan view), the portions of the third adhesive portion 480c protruding from the vertices formed by the sidewalls 110S of the first semiconductor chip 100 may each have a circular shape. However, the shape of the third adhesive portion 480c is not limited thereto.

Figure 5:
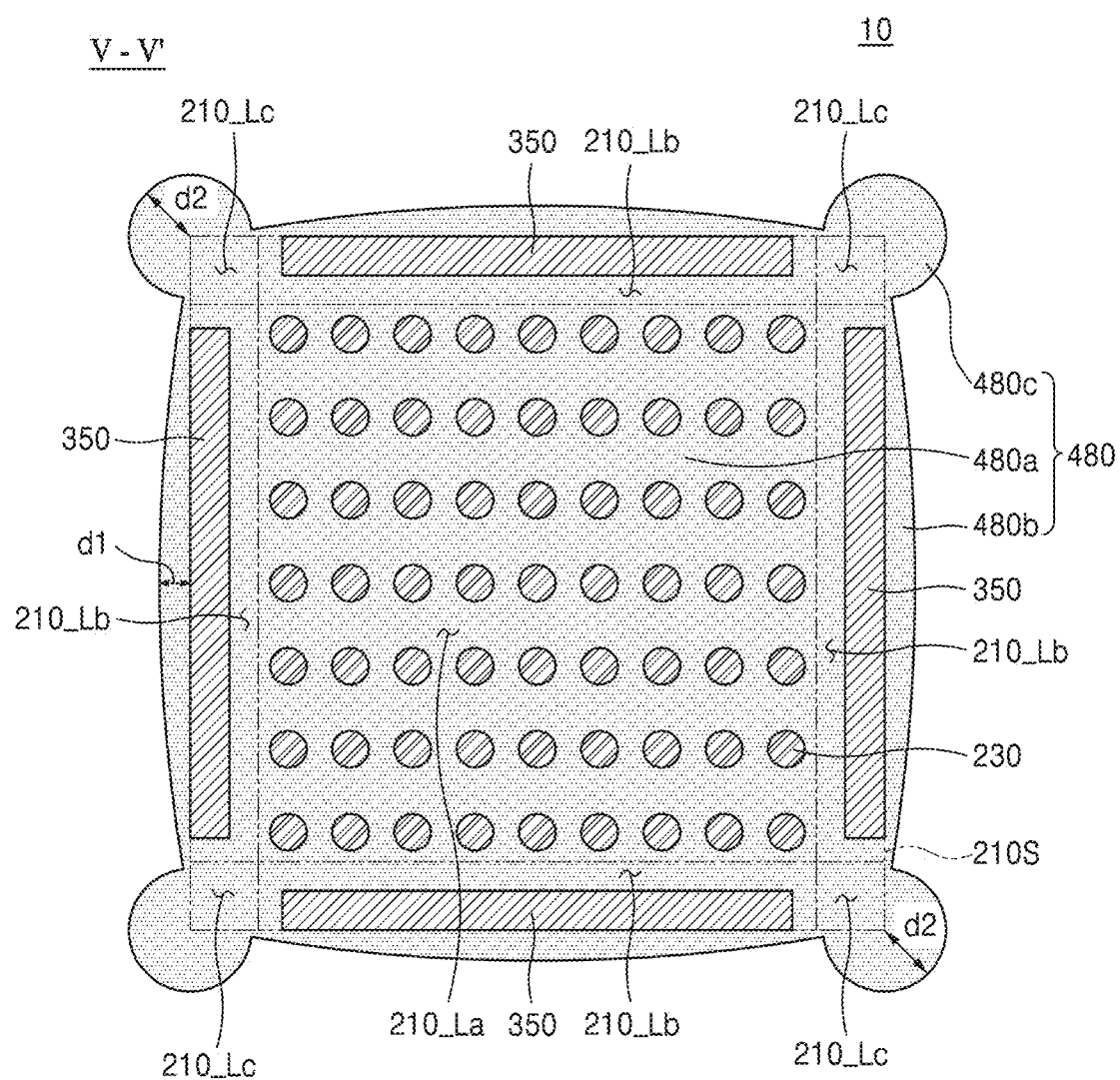
FIG. 5 is a cross-sectional view of a region taken along a line V-V' of FIG. 1.

FIG. 5 is a cross-sectional view of a region taken along a line V-V' of FIG. 1.

Referring to FIG. 5, the bottom surface 210_L of the second semiconductor substrate 210 may include a second center portion 210_La, a second edge portion 210_Lb, and a second corner portion 210_Lc.

The second center portion 210_La of the bottom surface 210_L of the second semiconductor substrate 210 may be a portion of the bottom surface 210_L of the second semiconductor substrate 210 on which the at least one second lower chip pad 230 is disposed. The second edge portion 210_Lb of the bottom surface 210_L of the second semiconductor substrate 210 is provided outside the second center portion 210_La and may be a portion of the bottom surface 210_L of the second semiconductor substrate 210 on which the upper dam structure 350 is disposed. Also, the second corner portion 210_Lc of the bottom surface 210_L of the second semiconductor substrate 210 is provided outside the second center portion 210_La and may be a portion of the bottom surface 210_L of the second semiconductor substrate 210 adjacent to vertices formed by the sidewalls 210S of the second semiconductor substrate 210.

In some example embodiments, the first adhesive portion 480a of the adhesive layer 480 may be disposed under the second center portion 210_La of the second semiconductor substrate 210 and surround the at least one second lower chip pad 230.

In some example embodiments, the second adhesive portion 480b of the adhesive layer 480 may be disposed under the second edge portion 210_Lb of the second semiconductor substrate 210 and surround the upper dam structure 350. Also, portions of the second adhesive portion 480b may protrude by the first protruding distance d1 from the sidewalls 210S of the second semiconductor chip 200.

Also, when the semiconductor package 10 is viewed from above (e.g., in a plan view), the portions of the second adhesive portion 480b protruding from the sidewalls 210S of the second semiconductor chip 200 may each have a semi-elliptical shape. However, the shape of the second adhesive portion 480b is not limited thereto.

In some example embodiments, the third adhesive portion 480c of the adhesive layer 480 may be disposed on the second corner portion 210_Lc of the second semiconductor substrate 210. Also, portions of the third adhesive portion 480c may protrude from vertices formed by the sidewalls 210S of the second semiconductor chip 200 by the second protruding distance d2 that is greater than the first protruding distance d1.

Also, when the semiconductor package 10 is viewed from above (e.g., in a plan view), the portions of the third adhesive portion 480c protruding from the vertices formed by the sidewalls 210S of the second semiconductor chip 200 may each have a circular shape. However, the shape of the third adhesive portion 480c is not limited thereto.

Because the semiconductor package 10 may include the lower dam structure 330 and the upper dam structure 350, during an operation of mounting the second semiconductor chip 200 on the first semiconductor chip 100, the second semiconductor chip 200 may be prevented (and/or protected) from being tilted.

Also, because the semiconductor package 10 may include the lower dam structure 330 and the upper dam structure 350, during an operation of mounting the second semiconductor chip 200 on the first semiconductor chip 100, a short problem (e.g., short circuit problem) between the chip connecting terminals 450 may be prevented (and/or protected from).

In a semiconductor package according to a comparative example, the lower dam structure 330 and the upper dam structure 350 may be omitted. In the case of the semiconductor package according to the comparative example, in an operation of mounting the second semiconductor chip 200 on the first semiconductor chip 100, the adhesive layer 480 may be disposed between the first center portion 110_Ua of the first semiconductor substrate 110 and the second center portion 210_La of the second semiconductor chip 200, but the adhesive layer 480 may not be disposed between the first corner portion 110_Uc of the first semiconductor substrate 110 and the second corner portion 210_Lc of the second semiconductor substrate 210. Therefore, the structural reliability of the semiconductor package according to the comparative example may be weak.

Because the semiconductor package 10 may include the lower dam structure 330 and the upper dam structure 350, during the operation of mounting the second semiconductor chip 200 on the first semiconductor chip 100, the adhesive layer 480 may be disposed between the first corner portion 110_Uc of the first semiconductor substrate 110 and the second corner portion 210_Lc of the second semiconductor substrate 210. Therefore, the structural reliability of the semiconductor package 10 according to the inventive concept may be improved.

Figure 6:
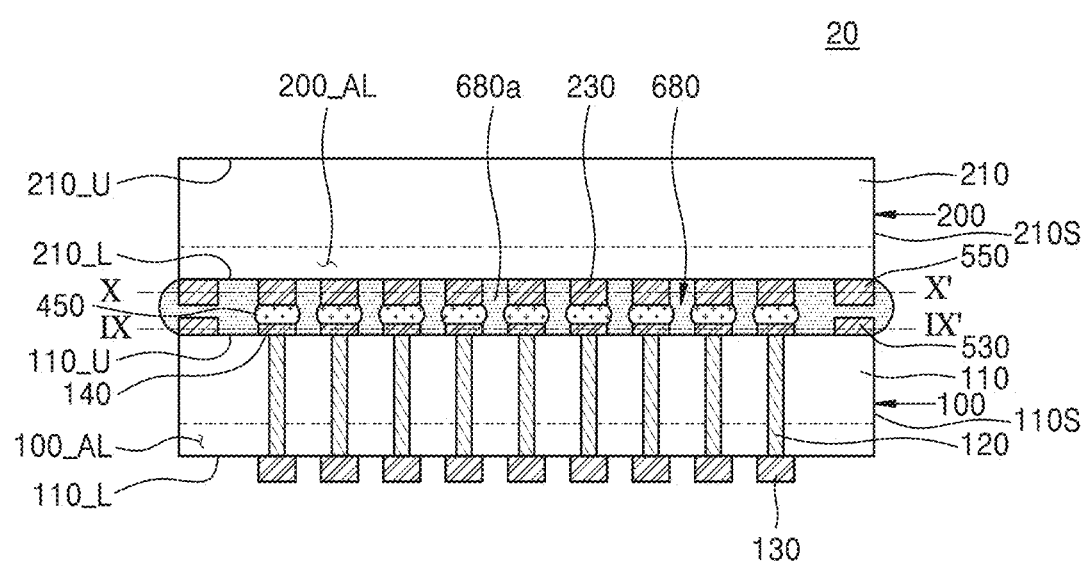
FIG. 6 is a cross-sectional view of a semiconductor package according to some example embodiments of the inventive concepts.
Figure 7:
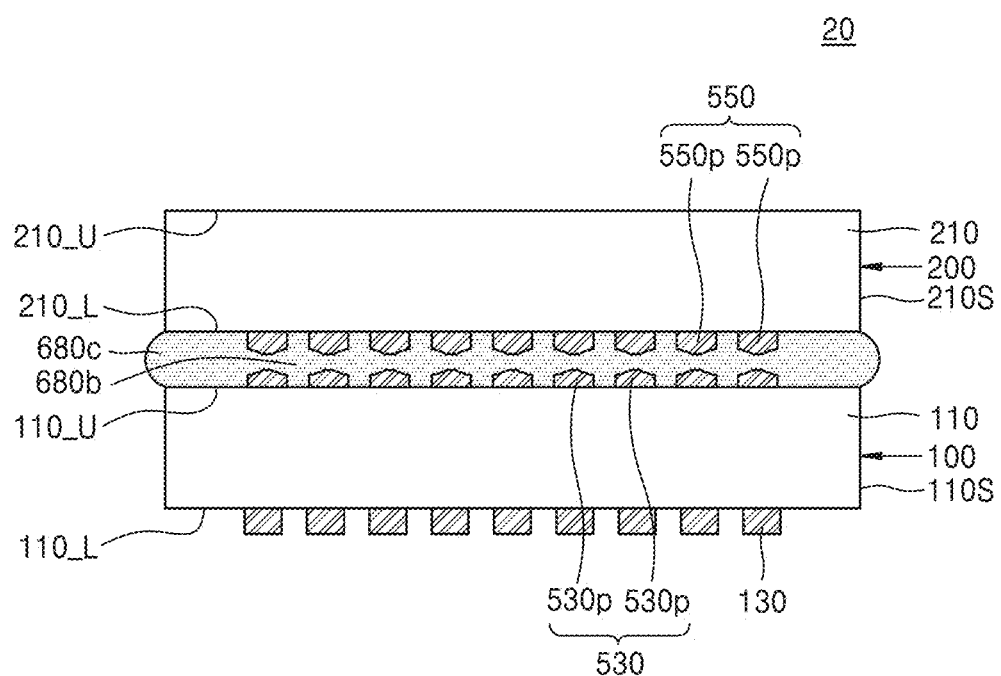
FIG. 7 is a side view of a semiconductor package according to some example embodiments of the inventive concepts.
Figure 8:
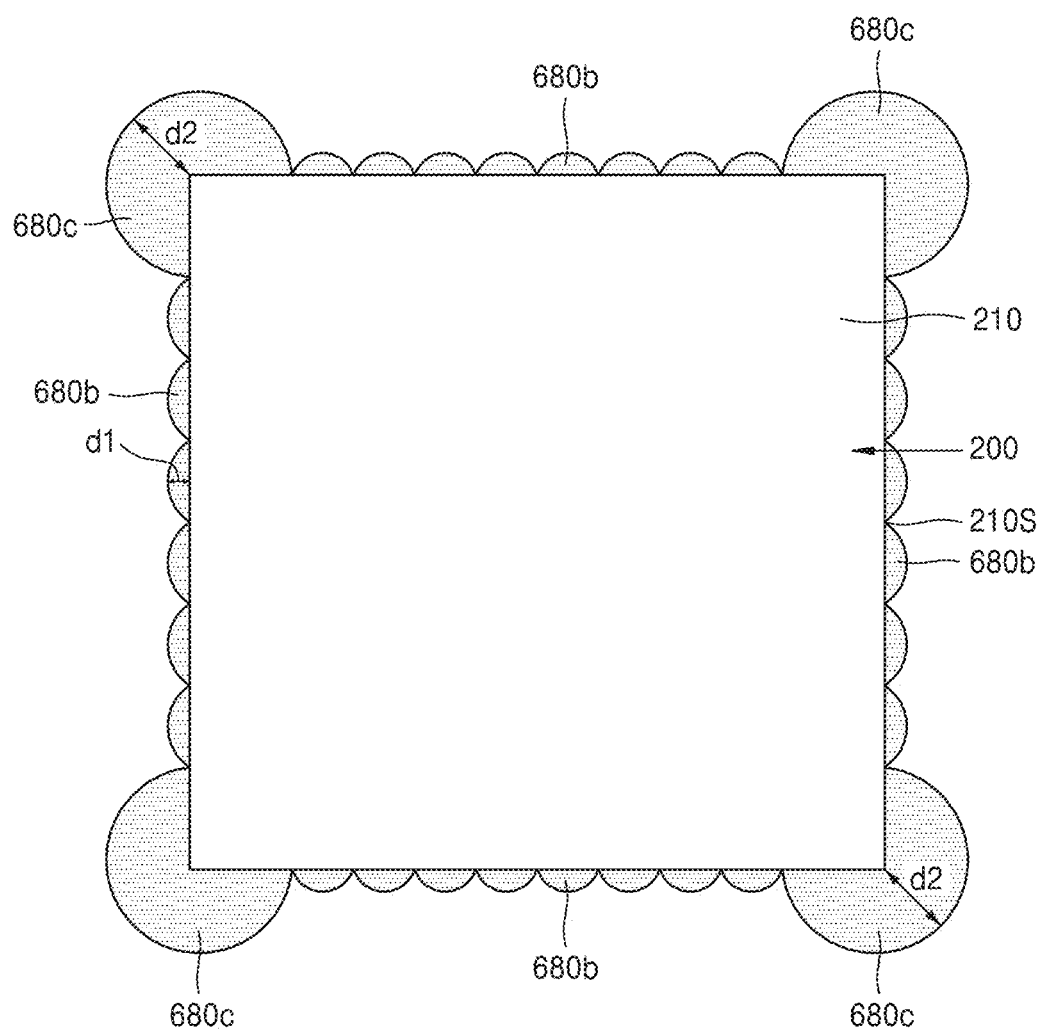
FIG. 8 is a plan view of a semiconductor package according to some example embodiments of the inventive concepts.

FIG. 6 is a cross-sectional view of a semiconductor package 20 according to some example embodiments of the inventive concepts. FIG. 7 is a side view of the semiconductor package 20 according to some example embodiments of the inventive concepts. FIG. 8 is a plan view of the semiconductor package 20 according to some example embodiments of the inventive concepts.

Referring to FIGS. 6 to 8 together, the semiconductor package 20 according to some example embodiments of the inventive concepts may include the first semiconductor chip 100, the second semiconductor chip 200, a lower dam structure 530, an upper dam structure 550, the at least one chip connecting terminal 450, and an adhesive layer 680.

Hereinafter, the first and second semiconductor chips 100 and 200 in the semiconductor package 20 may be substantially similar to the first and second semiconductor chips 100 and 200 of the semiconductor package 10, and therefore identical descriptions between the semiconductor package 10 of FIGS. 1 to 5 and the semiconductor package 20 of FIGS. 6 to 8 may be omitted, and differences therebetween will be focused on.

The first semiconductor chip 100 may include the first semiconductor substrate 110 having the first active layer 100_AL, the at least one first via electrode 120, the at least one first lower chip pad 130, and the at least one first upper chip pad 140.

The lower dam structure 530 may be disposed at an edge of the top surface 110_U of the first semiconductor substrate 110. In some example embodiments, the lower dam structure 530 may include a plurality of lower dam protrusions 530p arranged on edges of the top surface 110_U of the first semiconductor substrate 110 and spaced apart from one another in a horizontal direction.

In some example embodiments, the lower dam protrusions 530p may each have a rectangular prism shape. However, the example embodiments are not limited thereto, and the lower dam protrusions 530p may have a different shape, such as a cylindrical shape.

In some example embodiments, the material constituting the lower dam structure 530 may be substantially the same as the material constituting the at least one first upper chip pad 140. For example, the lower dam structure 530 and the at least one first upper chip pad 140 may include copper (Cu).

In some example embodiments, the length of each of the lower dam protrusions 530p in the vertical direction (e.g., the height of the lower dam protrusions 530p) may be greater than the length of the at least one first upper chip pad 140 in the vertical direction (e.g., the height of the at least one first upper chip pad 140). For example, the height of each of the lower dam protrusions 530p may be from about 3 micrometers to about 50 micrometers.

Also, in some example embodiments, a separation distance between the lower dam protrusions 530p in the horizontal direction may be from about 5 micrometers to about 300 micrometers. However, the separation distance between the lower dam protrusions 530*p* in the horizontal direction is not limited thereto.

The second semiconductor chip 200 may be a semiconductor chip mounted on the first semiconductor chip 100. In some example embodiments, the second semiconductor chip 200 may include the second semiconductor substrate 210, which includes the second active layer 200_AL, and the at least one second lower chip pad 230.

The upper dam structure 550 may be disposed at an edge of the bottom surface 210_L of the second semiconductor substrate 210. In some example embodiments, the upper dam structure 550 may include a plurality of upper dam protrusions 550*p* arranged on edges of the bottom surface 210_L of the second semiconductor substrate 210 and spaced apart from one another in the horizontal direction.

In some example embodiments, the upper dam protrusions 550*p* may each have a rectangular prism shape. However, the example embodiments are not limited thereto, and the upper dam protrusions 550*p* may each have a different shape, such as a cylindrical shape.

In some example embodiments, the upper dam protrusions 550*p* of the upper dam structure 550 may be arranged to overlap the lower dam protrusions 530*p* of the lower dam structure 530 in the vertical direction, respectively.

In some example embodiments, the material constituting the upper dam structure 550 may be substantially the same as the material constituting the at least one second lower chip pad 230. For example, the upper dam structure 550 and the at least one second lower chip pad 230 may include copper (Cu).

In some example embodiments, the height of each of the upper dam protrusions 550*p* may be substantially the same as the height of the second lower chip pad 230 in the vertical direction. For example, the height of each of the upper dam protrusions 550*p* may be from about 10 micrometers to about 100 micrometers.

Also, in some example embodiments, the height of the upper dam protrusions 550*p* may be greater than the height of the lower dam protrusions 530*p*. For example, when the height of the each of the lower dam protrusions 530*p* is from about 3 micrometers to about 50 micrometers, the height of each of the upper dam protrusions 550*p* may be greater than the height of the lower dam protrusions 530*p* in the vertical direction within the range from about 10 micrometers to about 100 micrometers.

The at least one chip connecting terminal 450 of the semiconductor package 20 may be provided between the at least one first upper chip pad 140 of the first semiconductor chip 100 and the at least one second lower chip pad 230 of the second semiconductor chip 200, thereby electrically connecting the first semiconductor chip 100 to the second semiconductor chip 200.

The adhesive layer 680 of the semiconductor package 20 may be disposed between the first semiconductor chip 100 and the second semiconductor chip 200 and surround the at least one first upper chip pad 140, the at least one second lower chip pad 230, and the at least one chip connecting terminal 450.

In some example embodiments, the adhesive layer 680 may include a first adhesive portion 680*a*, which is disposed between the first semiconductor chip 100 and the second semiconductor chip 200 and overlaps center portions of the first semiconductor chip 100 and the second semiconductor chip 200 in the vertical direction, a second adhesive portion 680*b*, which is disposed between edges of the first semiconductor chip 100 and edges of the second semiconductor chip 200 and protrudes from the sidewalls 110S of the first semiconductor chip 100 and the sidewalls 210S of the second semiconductor chip 200 by the first protruding distance d1, and a third adhesive portion 680*c*, which is disposed between corners of the first semiconductor chip 100 and corners of the second semiconductor chip 200 and protrudes from vertices formed by the sidewalls 110S of the first semiconductor chip 100 and vertices formed by the sidewalls 210S of the second semiconductor chip 200 by a second protruding distance d2 that is greater than the first protruding distance d1.

The first to third adhesive portions 680*a*, 680*b*, and 680*c* of the adhesive layer 680 will be described below in detail with reference to FIGS. 9 and 10.

Figure 9:
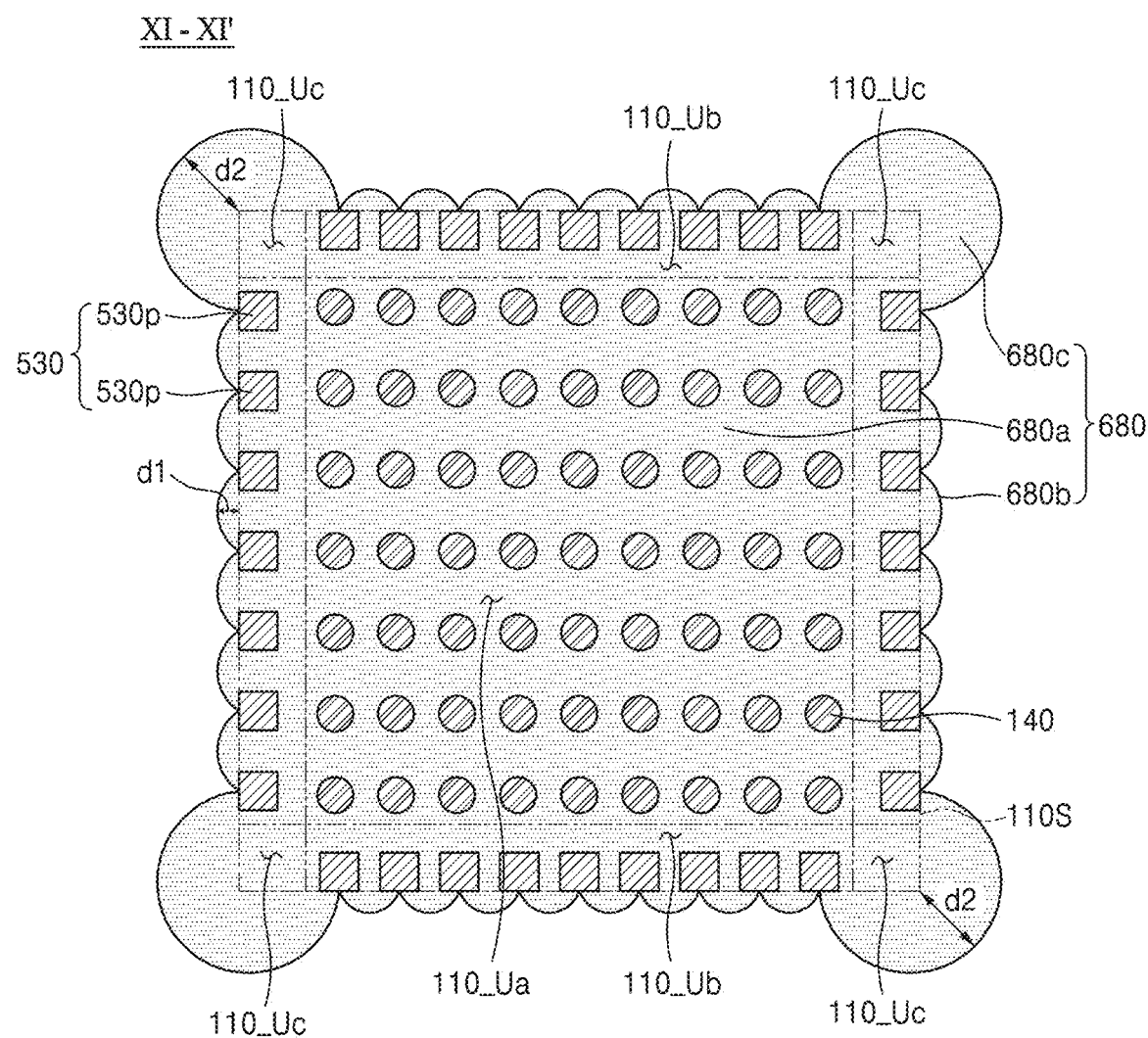
FIG. 9 is a cross-sectional view of a region taken along a line IX-IX' of FIG. 6.

FIG. 9 is a cross-sectional view of a region taken along a line IX-IX' of FIG. 6.

Referring to FIG. 9, the top surface 110_U of the first semiconductor substrate 110 may include the first center portion 110_Ua, the first edge portion 110_Ub, and the first corner portion 110_Uc.

In some example embodiments, the first adhesive portion 680*a* of the adhesive layer 680 may be disposed on the first center portion 110_Ua of the first semiconductor substrate 110 and surround the at least one first upper chip pad 140.

In some example embodiments, the second adhesive portion 680*b* of the adhesive layer 680 may be disposed on the first edge portion 110_Ub of the first semiconductor substrate 110 and surround the lower dam protrusions 530*p*. Portions of the second adhesive portion 680*b* may protrude by the first protruding distance d1 from the sidewalls 110S of the first semiconductor chip 100.

In some example embodiments, the portions of the second adhesive portion 680*b* may protrude outward from spaces between the lower dam protrusions 530*p*, and the portions of the second adhesive portion 680*b* protruding from the spaces may each have a semi-elliptical and/or semi-circular shape.

In some example embodiments, the third adhesive portion 680*c* of the adhesive layer 680 may be disposed on the first corner portion 110_Uc of the first semiconductor substrate 110. Also, portions of the third adhesive portion 680*c* may protrude from vertices formed by the sidewalls 110S of the first semiconductor chip 100 by the second protruding distance d2 that is greater than the first protruding distance d1.

Also, when the semiconductor package 20 is viewed from above, the portions of the third adhesive portion 680*c* protruding from the vertices formed by the sidewalls 110S of the first semiconductor chip 100 may each have a circular shape. However, the shape of the third adhesive portion 680*c* is not limited thereto.

The adhesive layer 680 may have the second adhesive portion 680*b* and the third adhesive portion 680*c*, and thus side surfaces of the adhesive layer 680 may have a concave-convex shape in which concavities and convexities are repeated.

Figure 10:
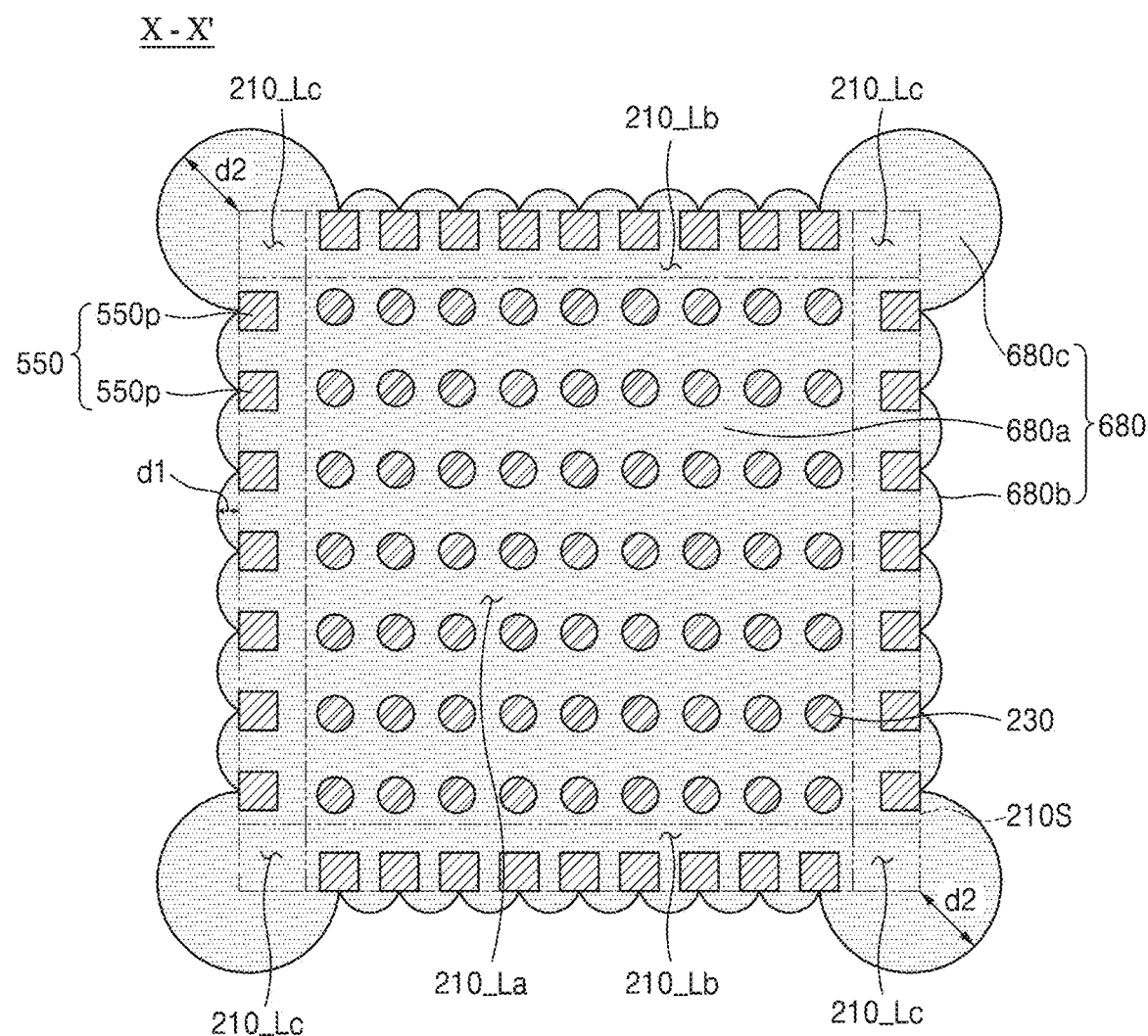
FIG. 10 is a cross-sectional view of a region taken along a line X-X' of FIG. 6.

FIG. 10 is a cross-sectional view of a region taken along a line X-X' of FIG. 6.

Referring to FIG. 10, the bottom surface 210_L of the second semiconductor substrate 210 may include the second center portion 210_La, the second edge portion 210_Lb, and the second corner portion 210_Lc.

In some example embodiments, the first adhesive portion 680*a* of the adhesive layer 680 may be disposed under the second center portion 210_La of the second semiconductor substrate 210 and surround the at least one second lower chip pad 230.

In some example embodiments, the second adhesive portion 680b of the adhesive layer 680 may be disposed under the second edge portion 210_Lb of the second semiconductor substrate 210 and surround the upper dam protrusions 550p. Portions of the second adhesive portion 680b may protrude by the first protruding distance d1 from the sidewalls 210S of the second semiconductor chip 200.

In some example embodiments, the portions of the second adhesive portion 680b may protrude outward from spaces between the upper dam protrusions 550p, and the portions of the second adhesive portion 680b protruding from the spaces may each have a semi-elliptical and/or a semi-circular shape.

In some example embodiments, the third adhesive portion 680c of the adhesive layer 680 may be disposed on the second corner portion 210_Lc of the second semiconductor substrate 210. Also, portions of the third adhesive portion 680c may protrude from vertices formed by the sidewalls 210S of the second semiconductor chip 200 by the second protruding distance d2 that is greater than the first protruding distance d1.

Also, when the semiconductor package 20 is viewed from above, the portions of the third adhesive portion 680c protruding from the vertices formed by the sidewalls 210S of the second semiconductor chip 200 may each have a circular shape. However, the shape of the third adhesive portion 680c is not limited thereto.

Because the semiconductor package 20 may include the lower dam structure 530 including the plurality of lower dam protrusions 530p and the upper dam structure 550 including the upper dam protrusions 550p, the second semiconductor chip 200 may be prevented from being tilted in an operation of mounting the second semiconductor chip 200 on the first semiconductor chip 100.

Also, because the semiconductor package 20 may include the lower dam structure 530 including the plurality of lower dam protrusions 530p and the upper dam structure 550 including the upper dam protrusions 550p, a short problem between the chip connecting terminals 450 may be prevented in the operation of mounting the second semiconductor chip 200 on the first semiconductor chip 100.

Also, because the semiconductor package 20 may include the lower dam structure 530 including the plurality of lower dam protrusions 530p and the upper dam structure 550 including the upper dam protrusions 550p, the adhesive layer 680 may be disposed between the first corner portion 110_Uc of the first semiconductor substrate 110 and the second corner portion 210_Lc of the second semiconductor substrate 210 in the operation of mounting the second semiconductor chip 200 on the first semiconductor chip 100. Therefore, the structural reliability of the semiconductor package 20 may be improved.

Figure 11:
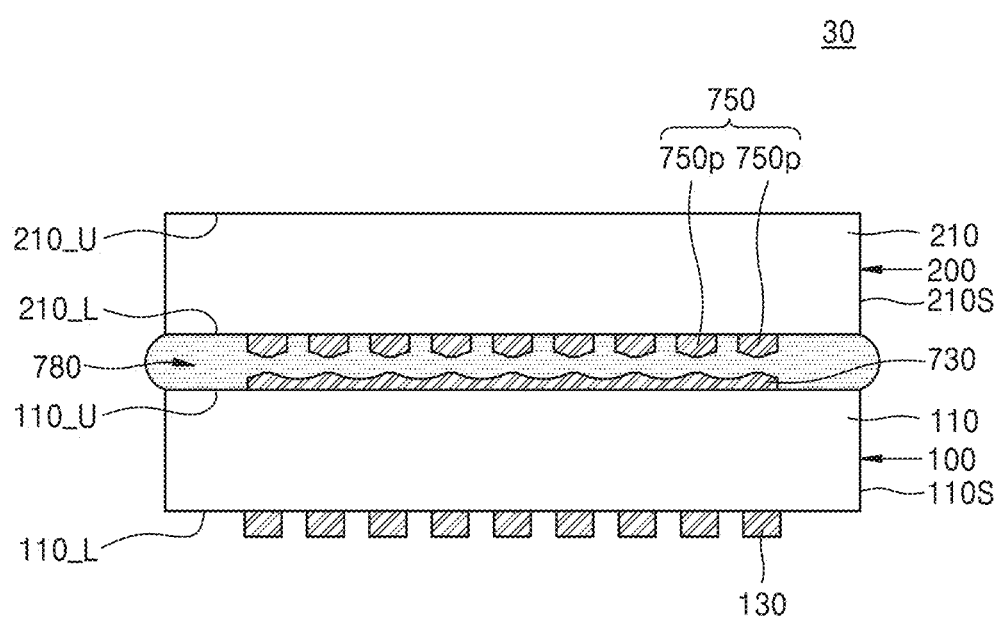
FIG. 11 is a side view of a semiconductor package according to some example embodiments of the inventive concepts.

FIG. 11 is a side view of a semiconductor package 30 according to some example embodiments of the inventive concepts.

Referring to FIG. 11, the semiconductor package 30 may include the first semiconductor chip 100, the second semiconductor chip 200, a lower dam structure 730, an upper dam structure 750 including a plurality of upper dam protrusions 750p, a chip connecting terminal (not shown), and an adhesive layer 780.

Hereinafter, the first and second semiconductor chips 100 and 200 in the semiconductor package 300 may be substantially similar to the first and second semiconductor chips 100 and 200 of the semiconductor package 10, and therefore identical descriptions between the semiconductor package 10 of FIGS. 1 to 5 and the semiconductor package 30 of FIG. 11 may be omitted, and differences therebetween will be focused on.

The lower dam structure 730 may be disposed at an edge of the top surface 110_U of the first semiconductor substrate 110. In some example embodiments, the lower dam structure 730 may include a plurality of lower dam structures 730. For example, four lower dam structures 730 may be provided.

In some example embodiments, when the semiconductor package 30 is viewed from above, the first semiconductor substrate 110 may have a rectangular shape having four sidewalls 110S. The four lower dam structures 730 may be provided such that the lower dam structures 730 may each have a rectangular prism shape. Also, the lower dam structures 730 may be arranged at edges of the top surface 110_U of the first semiconductor substrate 110 to be adjacent to the sidewalls 110S of the first semiconductor substrate 110, respectively.

In some example embodiments, the length of the lower dam structure 730 in a horizontal direction may be less than the corresponding length of the sidewall 110S of the first semiconductor substrate 110 in the horizontal direction.

The upper dam structure 750 may be disposed at an edge of the bottom surface 210_L of the second semiconductor substrate 210. In some example embodiments, the upper dam structure 750 may include the upper dam protrusions 750p arranged on edges of the bottom surface 210_L of the second semiconductor substrate 210 and spaced apart from one another in the horizontal direction.

In some example embodiments, the upper dam protrusions 750p may each have a rectangular prism shape. However, the example embodiments are not limited thereto, and the upper dam protrusions 750p may have a different shape, such as a cylindrical shape.

In some example embodiments, the upper dam protrusions 750p of the upper dam structure 750 may be arranged to overlap lower dam protrusions of the lower dam structure 730 in the vertical direction.

The adhesive layer 780 may be disposed between the first semiconductor chip 100 and the second semiconductor chip 200 and surround the lower dam structure 730 and the upper dam structure 750. Also, portions of the adhesive layer 780 may protrude from the sidewalls 110S of the first semiconductor chip 100 and the sidewalls 210S of the second semiconductor chip 200, and side surfaces of the adhesive layer 780 may have a concave-convex shape in which concavities and convexities are repeated.

Figure 12:
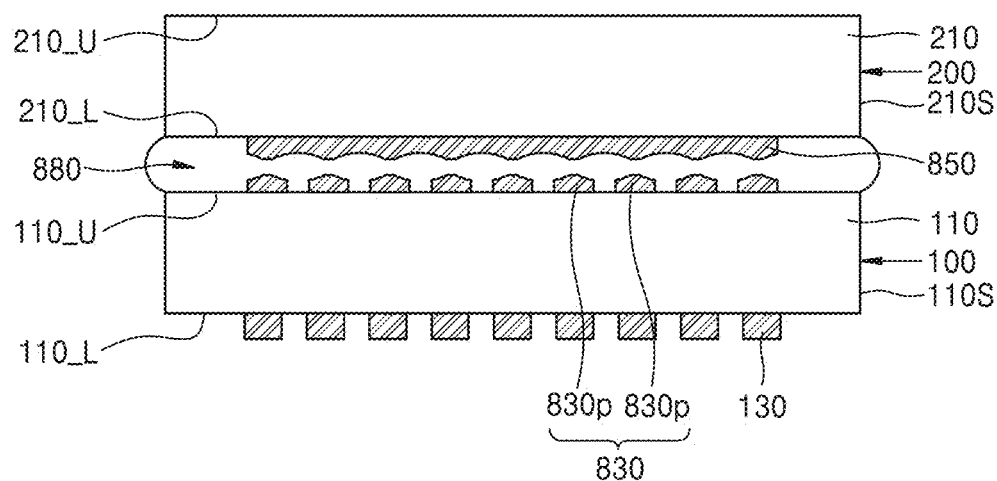
FIG. 12 is a side view of a semiconductor package according to some example embodiments of the inventive concepts.

FIG. 12 is a side view of a semiconductor package 40 according to some example embodiments of the inventive concept.

Referring to FIG. 12, the semiconductor package 40 may include the first semiconductor chip 100, the second semiconductor chip 200, a lower dam structure 830 including a plurality of lower dam protrusions 830p, an upper dam structure 850, a chip connecting terminal (not shown), and an adhesive layer 880.

Hereinafter, the first and second chips 100 and 200 in the semiconductor package 40 may be substantially similar to the first and second semiconductor chips 100 and 200 of the semiconductor package 10, and therefore identical descriptions between the semiconductor package 10 of FIGS. 1 to 5 and the semiconductor package 40 of FIG. 12 may be omitted, and differences therebetween will be focused on.

The lower dam structure 830 may be disposed at an edge of the top surface 110_U of the first semiconductor substrate 110. In some example embodiments, the lower dam structure 830 may include the lower dam protrusions 830p arranged on edges of the top surface 110_U of the first semiconductor substrate 110 and spaced apart from one another in the horizontal direction.

In some example embodiments, the lower dam protrusions 830p may each have a rectangular prism shape. However, the example embodiments are not limited thereto, and the lower dam protrusions 830p may have a different shape, such as a cylindrical shape.

In some example embodiments, the lower dam protrusions 830p of the lower dam structure 830 may be arranged to overlap lower dam protrusions of the upper dam structure 850 in the vertical direction, respectively.

The upper dam structure 850 may be disposed at an edge of the bottom surface 210_L of the second semiconductor substrate 210. In some example embodiments, the upper dam structure 850 may include a plurality of upper dam structures 850. For example, four upper dam structures 850 may be provided.

In some example embodiments, when the semiconductor package 40 is viewed from above, the second semiconductor substrate 210 may have a rectangular shape having four sidewalls 210S. The four upper dam structures 850 may be provided such that the upper dam structures 850 may each have a rectangular prism shape. Also, the upper dam structures 850 may be arranged at edges of the bottom surface 210_L of the second semiconductor substrate 210 to be adjacent to the sidewalls 210S of the second semiconductor substrate 210, respectively.

In some example embodiments, the length of the upper dam structure 850 in a horizontal direction may be less than the corresponding length of the sidewall 210S of the second semiconductor substrate 210 in the horizontal direction.

The adhesive layer 880 may be disposed between the first semiconductor chip 100 and the second semiconductor chip 200 and surround the lower dam structure 830 and the upper dam structure 850. Also, portions of the adhesive layer 880 may protrude from the sidewalls 110S of the first semiconductor chip 100 and the sidewalls 210S of the second semiconductor chip 200, and side surfaces of the adhesive layer 880 may have a concave-convex shape in which concavities and convexities are repeated.

Figure 13:
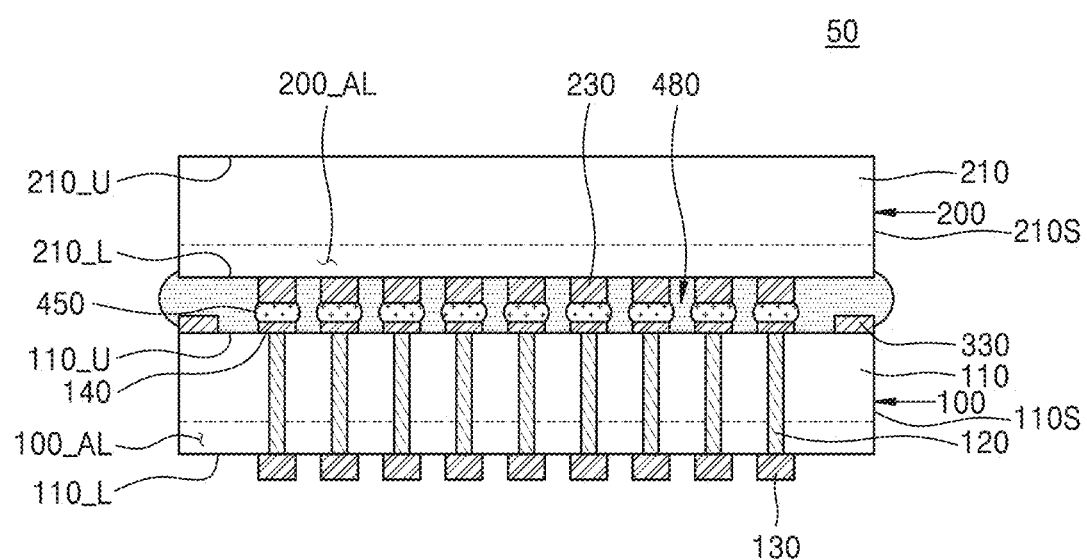
FIG. 13 is a cross-sectional view of a semiconductor package according to some example embodiments of the inventive concepts.

FIG. 13 is a cross-sectional view of a semiconductor package 50 according to some example embodiments of the inventive concepts.

Referring to FIG. 13, the semiconductor package 50 may include the first semiconductor chip 100, the second semiconductor chip 200, the lower dam structure 330, the chip connecting terminal 450, and the adhesive layer 480.

In comparison to, for example, semiconductor package 10, the semiconductor package 50 may include the lower dam structure 330 without the upper dam structure 350 described above with reference to FIG. 1.

In some example embodiments, the lower dam structure 330 may include four lower dam structures 330, and the lower dam structures 330 may each have a rectangular prism shape. The lower dam structures 330 may be arranged at edges of the top surface 110_U of the first semiconductor substrate 110 to be adjacent to the sidewalls 110S of the first semiconductor substrate 110, respectively. The length of the lower dam structure 330 in a horizontal direction may be less than the corresponding length of the sidewall 110S of the first semiconductor substrate 110 in the horizontal direction.

However, the example embodiments are not limited thereto, and the lower dam structure 330 may include a plurality of lower dam protrusions arranged on edges of the top surface 110_U of the first semiconductor substrate 110 and spaced apart from one another in the horizontal direction. Since descriptions of the lower dam protrusions are substantially similar to those given above with reference to FIGS. 6 to 10, detailed descriptions thereof will be omitted.

Figure 14:
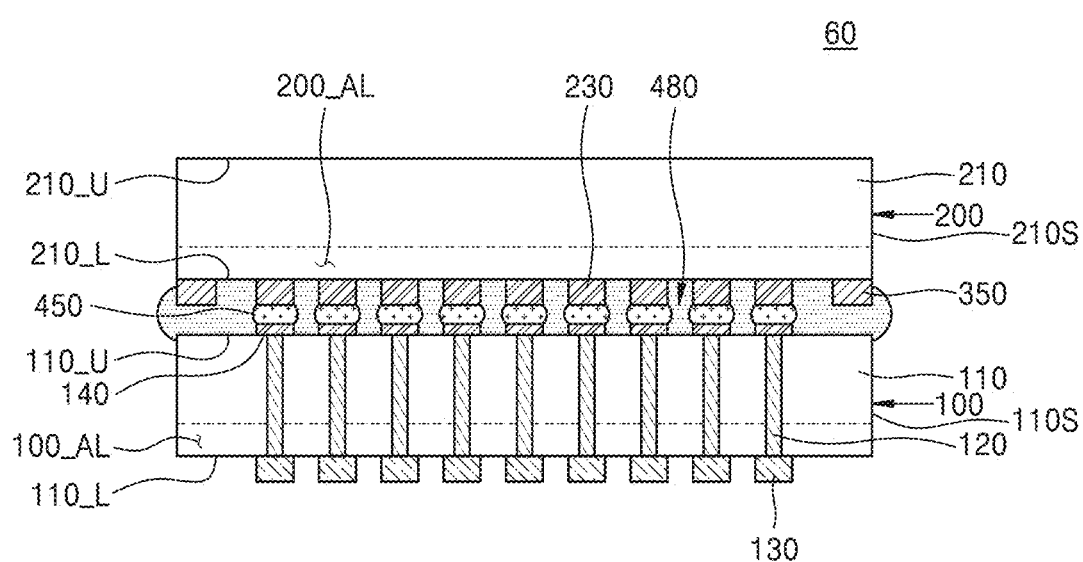
FIG. 14 is a cross-sectional view of a semiconductor package according to some example embodiments of the inventive concepts.

FIG. 14 is a cross-sectional view of a semiconductor package 60 according to some example embodiments of the inventive concepts.

Referring to FIG. 14, the semiconductor package 60 may include the first semiconductor chip 100, the second semiconductor chip 200, the upper dam structure 350, the chip connecting terminal 450, and the adhesive layer 480.

In comparison to, for example, semiconductor package 10, the semiconductor package 60 may include the upper dam structure 350 without the lower dam structure 330 described above with reference to FIG. 1.

In some example embodiments, the upper dam structure 350 may include four upper dam structures 350, and the upper dam structures 350 may each have a rectangular prism shape. The upper dam structures 350 may be arranged at edges of the bottom surface 210_L of the second semiconductor substrate 210 to be adjacent to the sidewalls 210S of the second semiconductor substrate 210, respectively. The length of the upper dam structure 350 in a horizontal direction may be less than the corresponding length of the sidewall 210S of the second semiconductor substrate 210 in the horizontal direction.

However, example embodiments are not limited thereto, and the upper dam structure 350 may include a plurality of upper dam protrusions arranged on edges of the bottom surface 210_L of the second semiconductor substrate 210 and spaced apart from one another in the horizontal direction. Since descriptions of the upper dam protrusions are substantially similar to those given above with reference to FIGS. 6 to 10, detailed descriptions thereof will be omitted.

Figure 15:
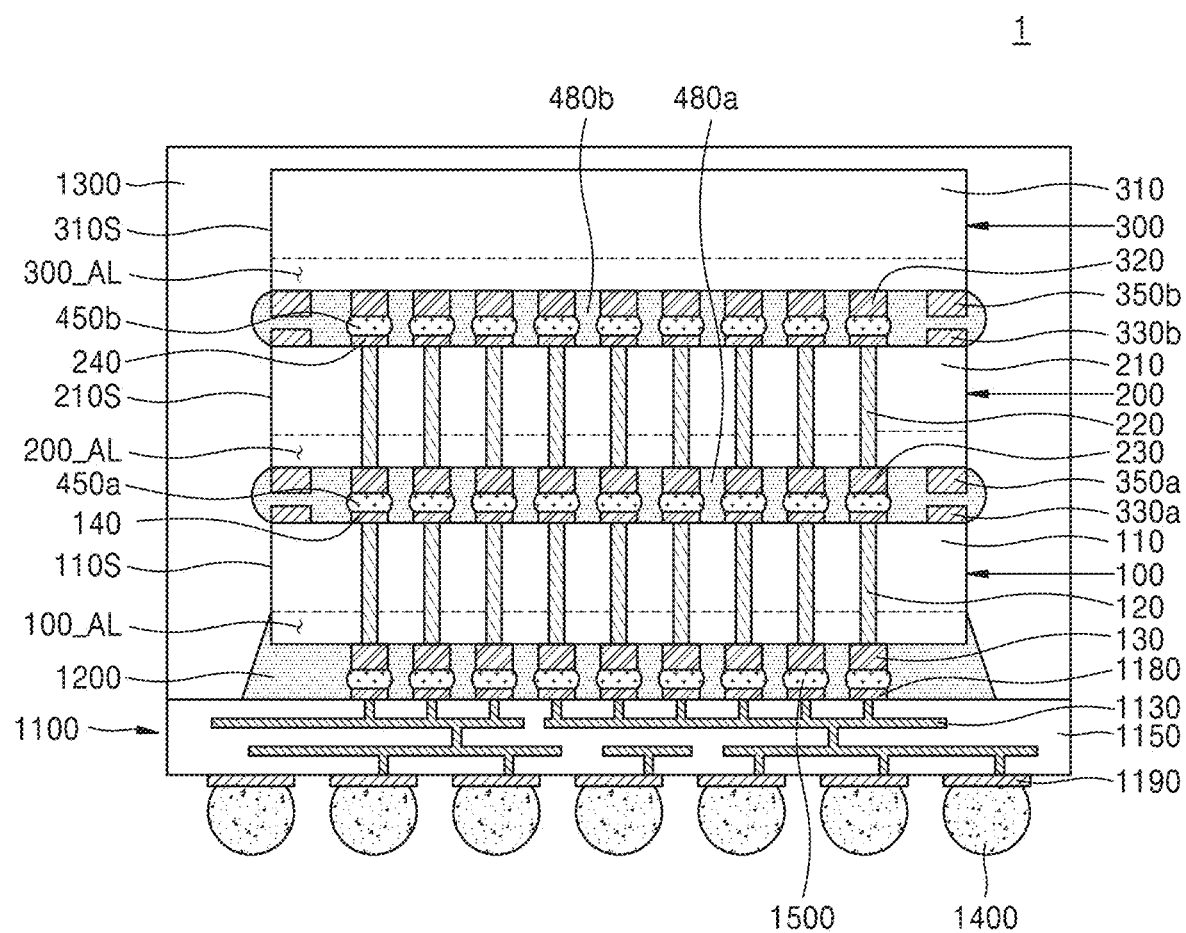
FIG. 15 is a cross-sectional view of a semiconductor package according to some example embodiments of the inventive concepts.

FIG. 15 is a cross-sectional view of a semiconductor package 1 according to some example embodiments of the inventive concepts.

Referring to FIG. 15, the semiconductor package 1 may include a package substrate 1100, the first semiconductor chip 100, the second semiconductor chip 200, a third semiconductor chip 300, a first chip connecting terminal 450a, a second chip connecting terminal 450b, a first adhesive layer 480a, a second adhesive layer 480b, first and second lower dam structures 330a and 330b, first and second upper dam structures 350a and 350b, a package connection terminal 1500, an underfill layer 1200, a molding layer 1300, and an external connection terminal 1400.

The package substrate 1100 may be a substrate for connecting the semiconductor chips 100, 200, and 300 to an external device (not illustrated). For example, in some example embodiments, the package substrate 1100 may be a printed circuit board (PCB). However, the package substrate 1100 is not limited to the structure and the material of a PCB and may include various types of substrates, e.g., a ceramic substrate.

The package substrate 1100 may include a substrate pattern 1130, a substrate insulation layer 1150, at least one upper substrate pad 1180, and at least one lower substrate pad 1190.

In some example embodiment, the substrate pattern 1130 may include a substrate line pattern, which includes a conductive material and extends in the horizontal direction within the substrate insulation layer 1150, and a substrate via pattern, which includes a conductive material and extends in the vertical direction.

The substrate insulation layer 1150 may surround the substrate pattern 1130. In some example embodiments, the material constituting the substrate insulation layer 1150 may include an insulating polymer, oxide, and/or a nitride. For example, the substrate insulation layer 1150 may include at least one of silicon oxide, silicon nitride, a phenol resin, an epoxy resin, a polyimide, and/or the like.

In some example embodiments, the at least one upper substrate pad 1180 may be and/or include a pad disposed on the top surface of the package substrate 1100 and configured to connect the first semiconductor chip 100 to the substrate pattern 1130. The at least one lower substrate pad 1190 may be and/or include a pad disposed on the bottom surface of the package substrate 1100 and configured to connect at least one external connection terminal 1400 to the substrate pattern 1130.

The first semiconductor chip 100 may be mounted on the package substrate 1100. The first semiconductor chip 100 may include the first semiconductor substrate 110 having the first active layer 100_AL, the at least one first via electrode 120, the at least one first lower chip pad 130, and at least one the first upper chip pad 140. Since the descriptions of the first semiconductor chip 100 are substantially similar to the descriptions given above with reference to FIGS. 1 to 5, detailed descriptions thereof will be omitted.

At least one package connection terminal 1500 may be disposed between the at least one first lower chip pad 130 of the first semiconductor chip 100 and the at least one upper substrate pad 1180 of the package substrate 1100 and may be configured to electrically connect the first active layer 100_AL of the first semiconductor chip 100 to the substrate pattern 1130.

The underfill layer 1200 may be disposed between the first semiconductor chip 100 and the package substrate 1100 and surround the at least one package connection terminal 1500. For example, in some example embodiments, the underfill layer 1200 may fix the first semiconductor chip 100 on to the top surface of the package substrate 1100.

In some example embodiments, the underfill layer 1200 may include at least any one of an insulating polymer and/or an epoxy resin. For example, the underfill layer 1200 may include an epoxy molding compound (EMC), a phenol resin, a polyimide, and/or the like.

A first lower dam structure 330a may be disposed at an edge of the top surface of the first semiconductor substrate 110. In some example embodiments, the first lower dam structure 330 may include a plurality of first lower dam structures 330a. For example, when the semiconductor package 1 is viewed from above, the first semiconductor substrate 110 may have a rectangular shape having four sidewalls 110S, and the first lower dam structures 330a may be arranged at edges of the top surface of the first semiconductor substrate 110 to be adjacent to the sidewalls 110S thereof, respectively.

The second semiconductor chip 200 may be mounted on the first semiconductor chip 100. The second semiconductor chip 200 may include the second semiconductor substrate 210 having the second active layer 200_AL, at least one second via electrode 220, the at least one second lower chip pad 230, and at least one second upper chip pad 240. Since the descriptions of the second semiconductor chip 200 are substantially similar to the descriptions given above with reference to FIGS. 1 to 5, detailed descriptions thereof will be omitted.

The first chip connecting terminal 450a may be provided between the first upper chip pad 140 of the first semiconductor chip 100 and the second lower chip pad 230 of the second semiconductor chip 200, thereby electrically connecting the first semiconductor chip 100 to the second semiconductor chip 200.

The first upper dam structure 350a may be disposed at an edge of the bottom surface of the second semiconductor substrate 210. In some example embodiments, the first upper dam structure 350 may include a plurality of first upper dam structures 350a. For example, when the semiconductor package 1 is viewed from above, the second semiconductor substrate 210 may have a rectangular shape having four sidewalls 210S, and the first upper dam structures 350a may be arranged at edges of the bottom surface of the second semiconductor substrate 210 to be adjacent to the sidewalls 210S thereof, respectively.

In some example embodiments, the first upper dam structures 350a may overlap the first lower dam structures 330a in the vertical direction. Also, the height of the first upper dam structure 350a may be greater than the height of the first lower dam structure 330a.

The first adhesive layer 480a may be disposed between the first semiconductor chip 100 and the second semiconductor chip 200 and surround the at least one first chip connecting terminal 450a, the first lower dam structure 330a, and the first upper dam structure 350a. Portions of the first adhesive layer 480a may protrude from the sidewalls 110S of the first semiconductor chip 100 and the sidewalls 210S of the second semiconductor chip 200. In some example embodiments, side surfaces of the first adhesive layer 480a may have a concave-convex shape in which concavities and convexities are repeated. In some alternative example embodiments, one of the first lower and upper dam structures 330a or 330b may be omitted.

The second lower dam structure 330b may be disposed at an edge of the top surface of the second semiconductor substrate 210. In some example embodiments, the second lower dam structure 330b may include a plurality of second lower dam structures 330b may be provided. For example, when the semiconductor package 1 is viewed from above, the second semiconductor substrate 210 may have a rectangular shape having four sidewalls 210S, and the second lower dam structures 330b may be arranged at edges of the top surface of the second semiconductor substrate 210 to be adjacent to the sidewalls 210S thereof, respectively.

The third semiconductor chip 300 may be mounted on the second semiconductor chip 200. The third semiconductor chip 300 may include a third semiconductor substrate 310 having a third active layer 300_AL and a at least one third lower chip pad 320 disposed on the bottom surface of the third semiconductor substrate 310 and connected to the third active layer 300_AL.

The second chip connecting terminal 450b may be provided between the at least one second upper chip pad 240 of the second semiconductor chip 200 and the at least one third lower chip pad 320 of the third semiconductor chip 300, thereby electrically connecting the second semiconductor chip 200 to the third semiconductor chip 300.

The second upper dam structure 350b may be disposed at an edge of the bottom surface of the third semiconductor substrate 310. In some example embodiments, the second upper dam structure 350b may include a plurality of second upper dam structures 350b. For example, when the semiconductor package 1 is viewed from above, the third semiconductor substrate 310 may have a rectangular shape having four sidewalls 310S, and the second upper dam structures 350b may be arranged at edges of the bottom surface of the third semiconductor substrate 310 to be adjacent to the sidewalls 310S, respectively.

In some example embodiments, the second upper dam structures 350b may overlap the second lower dam structures 330b in the vertical direction. Also, the height of the second upper dam structure 350b may be greater than the height of the second lower dam structure 330b.

The second adhesive layer 480b may be disposed between the second semiconductor chip 200 and the third semiconductor chip 300 and surround the at least one second chip connecting terminal 450b, the second lower dam structure 330b, and the second upper dam structure 350b. Portions of the second adhesive layer 480b may protrude from the sidewalls 210S of the second semiconductor chip 200 and the sidewalls 310S of the third semiconductor chip 300. In some example embodiments, side surfaces of the second adhesive layer 480b may have a concave-convex shape in which concavities and convexities are repeated. In some alternative example embodiments one of the second lower or upper dam structures 330b and 350b may be omitted.

The molding layer 1300 may be mounted on the package substrate 1100 and surround first to third semiconductor chips 100, 200, and 300, first and second adhesive layers 480a and 480b, and the underfill layer 1200.

In some example embodiments, the molding layer 1300 may include at least any one of an insulating polymer and an epoxy resin. For example, the molding layer 1300 may include, for example, an epoxy molding compound (EMC).

FIGS. 16 to 19 are diagrams showing operations of a method of manufacturing a semiconductor package according to some example embodiments of the inventive concepts, respectively.

Hereinafter, a method of manufacturing a semiconductor package according to some example embodiments of the inventive concepts will be described in detail with reference to FIGS. 16 to 19. The method of manufacturing a semiconductor package according to the semiconductor package 10 described above with reference to FIGS. 1 to 5. However, the example embodiments are not limited thereto, and may be applied to and/or modified to accommodate any of the example embodiments provided above.

Figure 16:
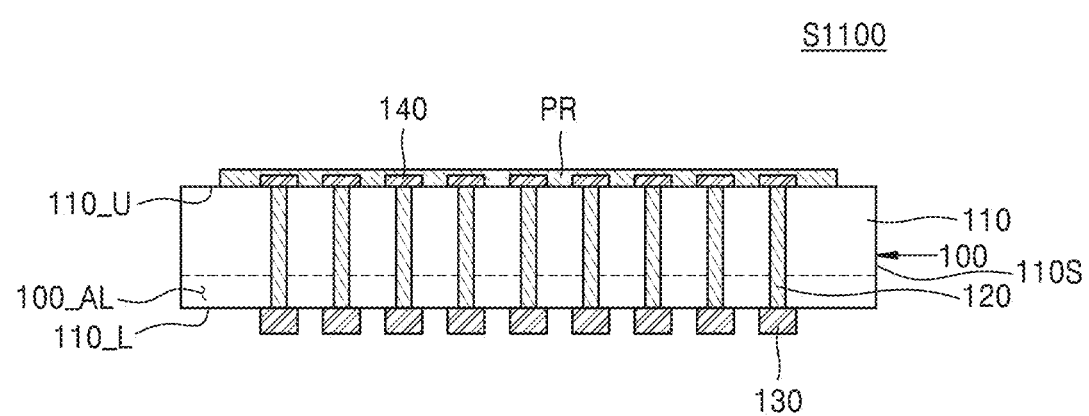
FIGS. 16 to 19 are diagrams showing operations of a method of manufacturing a semiconductor package according to some example embodiments of the inventive concepts, respectively.

Referring to FIG. 16, the method of manufacturing a semiconductor package may include operation S1100 of forming a photoresist material layer PR on the top surface 110_U of the first semiconductor substrate 110.

In some example embodiments, the photoresist material layer PR may be formed on the first center portion 110_Ua (FIG. 4) and the first corner portion 110_Uc (FIG. 4) of the top surface 110_U of the first semiconductor substrate 110. However, the photoresist material layer PR may be omitted from (e.g., not formed on) the first edge portion 110_Ub (FIG. 4) of the top surface 110_U of the first semiconductor substrate 110.

In some example embodiments, operation S1100 may include applying the photoresist material layer PR on the top surface 110_U of the first semiconductor substrate 110 to cover the at least one first upper chip pad 140, exposing the photoresist material layer PR, and developing the photoresist material layer PR to remove the photoresist material layer PR disposed on the first edge portion 110_Ub.

Figure 17:
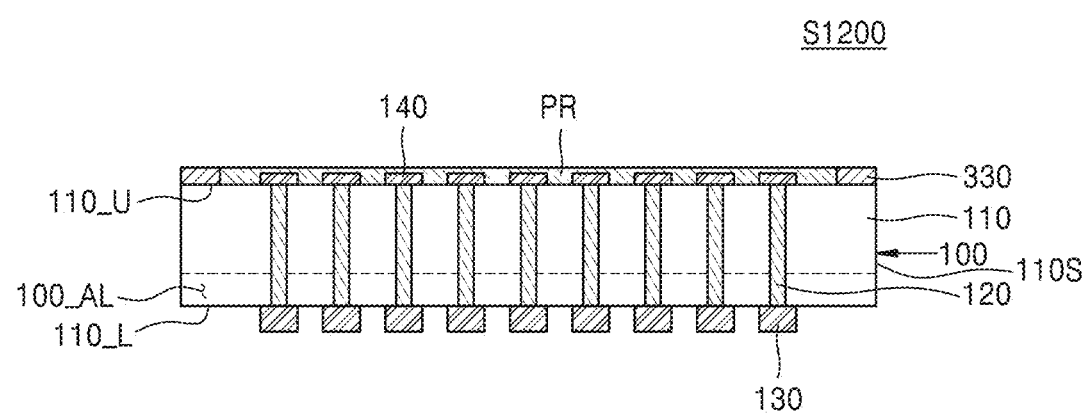

Referring to FIG. 17, the method of manufacturing a semiconductor package may include operation S1200 of forming the lower dam structure 330.

In some example embodiments, the lower dam structure 330 may be formed on a portion of the top surface 110_U of the first semiconductor substrate 110 exposed by the photoresist material layer PR. For example, the lower dam structure 330 may be formed on the first edge portion 110_Ub (FIG. 4) of the first semiconductor substrate 110 exposed by the photoresist material layer PR.

In some example embodiments, in operation S1200, the lower dam structure 330 may be formed, such that the length of the lower dam structure 330 in the vertical direction (e.g., the height of the lower dam structure 330) is greater than the length of the at least one first upper chip pad 140 in the vertical direction (e.g., the height of the at least one first upper chip pad 140).

In some example embodiments, the material constituting the lower dam structure 330 may include a metal like copper (Cu). However, the example embodiments are not limited thereto, and the lower dam structure 330 may include at least one of a PID material and/or a PSPI.

In some example embodiments, the material constituting the lower dam structure 330 may be substantially the same as the material constituting the at least one first upper chip pad 140. For example, the lower dam structure 330 and the first upper chip pad 140 may include copper (Cu). However, the example embodiments are not limited thereto, and the material constituting the lower dam structure 330 and the material constituting the first upper chip pad 140 may be different.

Figure 18:
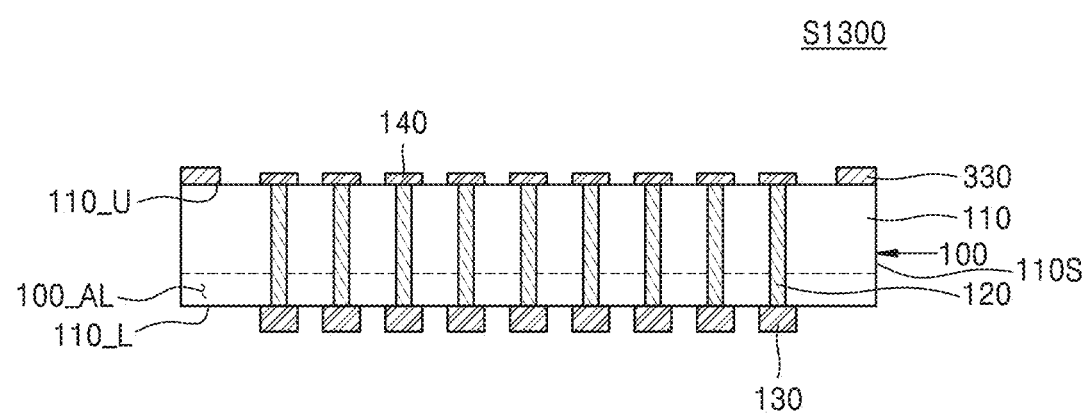

Referring to FIG. 18, the method of manufacturing a semiconductor package may include operation S1300 of removing the photoresist material layer PR.

In some example embodiments, in operation S1300, the photoresist material layer PR may be removed through an ashing process and/or a stripping process. However, the method of removing the photoresist material layer PR is not limited thereto.

Figure 19:
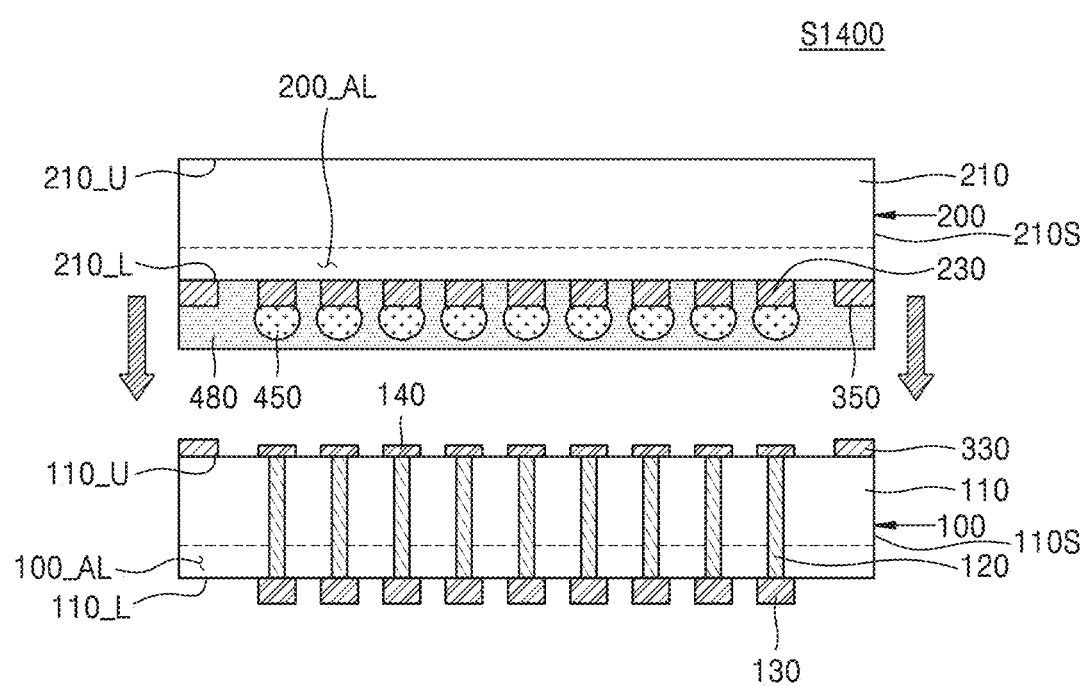

Referring to FIG. 19, the method of manufacturing a semiconductor package may include operation S1400 of mounting the second semiconductor chip 200 on the first semiconductor chip 100.

The upper dam structure 350 may be formed on the bottom surface 210_L of the second semiconductor chip 200. In some example embodiments, the method of forming the upper dam structure 350 on the bottom surface 210_L of the second semiconductor chip 200 may be substantially identical to the method of forming the lower dam structure 330 on the top surface 110_U of the first semiconductor chip 100 described above with reference to FIGS. 16 to 18, and thus detailed descriptions thereof will be omitted.

Alternatively, in some example embodiments, the upper dam structure 350 and the at least one second lower chip pad 230 may be formed in the same operation. For example, a photoresist material layer (not illustrated) may be formed on the bottom surface 210_L of the second semiconductor chip 200 such that may include a pattern for the at least one second lower chip pad 230 in the second center portion 210_La (FIG. 5) of the second semiconductor chip 200 and a pattern for the upper dam structure 350 in the second edge portion 210_Lb (FIG. 5) of the second semiconductor chip 200. A conductive material, such as copper (Cu), may be deposited in the pattern, and the photoresist material layer subsequently removed from the bottom surface 210_L of the second semiconductor chip 200.

Also, before operation S1400 is performed, the at least one chip connecting terminal 450 may be attached to the at least one second lower chip pad 230 of the second semiconductor chip 200. Also, the adhesive layer 480 may be disposed on the bottom surface 210_L of the second semiconductor chip 200 and cover the at least one second lower chip pad 230, at least one the chip connecting terminal 450, and the upper dam structure 350.

In operation S1400, the at least one chip connecting terminal 450 may contact the at least one first upper chip pad 140 of the first semiconductor chip 100. For example, through a thermal compression process, the at least one chip connecting terminal 450 may be connected to the at least one first upper chip pad 140.

Also, during the mounting of the second semiconductor chip 200, the adhesive layer 480 may be heated through the thermal compression process and may have fluidity. Therefore, the adhesive layer 480 may be disposed between the first center portion 110_Ua (FIG. 4) of the first semiconductor chip 100 and the second center portion 210_La (FIG. 5) of the second semiconductor chip 200, between the first edge portion 110_Ub (FIG. 4) of the first semiconductor chip 100 and the second edge portion 210_Lb (FIG. 5) of the second semiconductor chip 200, and between the first corner portion 110_Uc (FIG. 4) of the first semiconductor chip 100 and the second corner portion 210_Lc (FIG. 5) of the second semiconductor chip 200.

Also, in operation S1400, a portion of the adhesive layer 480 compressed through the thermal compression process may protrude from the sidewalls 110S of the first semiconductor chip 100 and the sidewalls 210S of the second semiconductor chip 200.

Since the lower dam structure 330 may be disposed on the top surface of the first semiconductor chip 100 and the upper dam structure 350 may be disposed on the bottom surface of the second semiconductor chip 200, the second semiconductor chip 200 may be prevented from being tilted in the operation of mounting the second semiconductor chip 200 on the first semiconductor chip 100.

Also, since the lower dam structure 330 may be disposed on the top surface of the first semiconductor chip 100 and/or the upper dam structure 350 may be disposed on the bottom surface of the second semiconductor chip 200, a short problem between chip connecting terminals 450 may be prevented in the operation of mounting the second semiconductor chip 200 on the first semiconductor chip 100. For example, the first semiconductor chip 100 and/or the upper dam structure 350 may physically stop the compression of the chip connecting terminals 450 and may be prevent (and/or mitigate the potential for) the chip connecting terminals 450 from being squeezed together.

Also, since the lower dam structure 330 may be disposed on the top surface of the first semiconductor chip 100 and the upper dam structure 350 may be disposed on the bottom surface of the second semiconductor chip 200, in the operation of mounting the second semiconductor chip 200 on the first semiconductor chip 100, the adhesive layer 480 may be disposed between the first corner portion 110_Uc of the first semiconductor substrate 110 and the second corner portion 210_Lc of the second semiconductor substrate 210. Therefore, the structural reliability of the semiconductor package 10 manufactured according may be improved.

While the inventive concepts have been particularly shown and described with reference to some example embodiments thereof, it will be understood that various changes in form and details may be made therein without departing from the spirit and scope of the following claims.

What is claimed is:

1. A semiconductor package comprising:
   a first semiconductor chip comprising a first semiconductor substrate having a first active layer, at least one first via electrode connected to the first active layer and penetrating through at least a portion of the first semiconductor substrate in a vertical direction, at least one first lower chip pad on a bottom surface of the first semiconductor substrate, and at least one first upper chip pad on a top surface of the first semiconductor substrate and connected to the at least one first via electrode;
   a lower dam structure on an edge of the top surface of the first semiconductor substrate;
   a second semiconductor chip mounted to the first semiconductor chip, the second semiconductor chip comprising a second semiconductor substrate having a second active layer, and at least one second lower chip pad on a bottom surface of the second semiconductor substrate;
   an upper dam structure on an edge of the bottom surface of the second semiconductor substrate;
   at least one chip connecting terminal electrically connecting the at least one first upper chip pad of the first semiconductor chip and the at least one second lower chip pad of the second semiconductor chip; and
   an adhesive layer between the first semiconductor chip and the second semiconductor chip, the adhesive layer surrounding the at least one first upper chip pad, the at least one second lower chip pad, and the at least one chip connecting terminal,
   wherein the adhesive layer is included in a space between an upper surface of the lower dam structure and a lower surface of the upper dam structure.

2. The semiconductor package of claim 1, wherein the top surface of the first semiconductor substrate comprises:
   a first center portion on which at least one the first upper chip pad is disposed;
   a first edge portion between the first center portion and sidewalls of the first semiconductor substrate and on which the lower dam structure is disposed; and
   a first corner portion outside the first center portion and adjacent to vertices where a plurality of sidewalls of the first semiconductor substrate meet one another, and
   wherein a length of the lower dam structure in a horizontal direction is less than a corresponding length of an adjacent sidewall of the first semiconductor substrate in the horizontal direction.

3. The semiconductor package of claim 2, wherein the bottom surface of the second semiconductor substrate comprises:
   a second center portion on which the second lower chip pad is disposed;
   a second edge portion between the second center portion and sidewalls of the second semiconductor substrate and on which the upper dam structure is disposed; and
   a second corner portion outside the second center portion and adjacent to vertices where a plurality of the sidewalls of the second semiconductor substrate meet one another, and
   wherein a length of the upper dam structure in the horizontal direction is less than a corresponding length of an adjacent sidewall of the second semiconductor substrate in the horizontal direction.

4. The semiconductor package of claim 3, wherein the adhesive layer comprises:
   a first adhesive portion between the first center portion of the first semiconductor substrate and the second center portion of the second semiconductor substrate;
   a second adhesive portion between the first edge portion of the first semiconductor substrate and the second edge portion of the second semiconductor substrate and protruding from the sidewalls of the first semiconductor substrate; and
   a third adhesive portion between the first corner portion of the first semiconductor substrate and the second corner portion of the second semiconductor substrate and protruding from the vertices of the first semiconductor substrate, and wherein a distance of the third adhesive portion that protrudes from a closest one of the vertices of the first semiconductor substrate is greater than a distance of the second adhesive portion that protrudes from a closest one of the sidewalls of the first semiconductor substrate.

5. The semiconductor package of claim 1, wherein the lower dam structure and the upper dam structure overlap in the vertical direction.

6. The semiconductor package of claim 1, wherein the lower dam structure and the upper dam structure each comprise at least any one of copper (Cu) or a photo imageable dielectric (PID) material.

7. The semiconductor package of claim 1, wherein a length of the lower dam structure in the vertical direction is greater than a length of the at least one first upper chip pad of the first semiconductor chip in the vertical direction.

8. The semiconductor package of claim 1, wherein a length of the upper dam structure in the vertical direction is greater than a length of the lower dam structure in the vertical direction.

9. The semiconductor package of claim 8, wherein the length of the upper dam structure in the vertical direction is identical to the length of the at least one second lower chip pad of the second semiconductor chip in the vertical direction.

10. The semiconductor package of claim 1, wherein a material constituting the upper dam structure is the same as a material constituting the at least one second lower chip pad.

11. The semiconductor package of claim 1, wherein
the lower dam structure includes a plurality of lower dam structures such that each of the plurality of lower dam structures is adjacent to a sidewall of the first semiconductor substrate,
each of the plurality of lower dam structures has a rectangular prism shape having a length in a horizontal direction that is less than a corresponding length of the adjacent sidewall of the first semiconductor substrate, and
the upper dam structure comprises a plurality of upper dam protrusions spaced apart from one another in the horizontal direction.

12. The semiconductor package of claim 1, wherein
the lower dam structure comprises a plurality of lower dam protrusions spaced apart from one another in a horizontal direction,
the upper dam structure includes a plurality of upper dam structures such that each of the plurality of upper dam structures is adjacent to a sidewall of the second semiconductor substrate, and
each of the plurality of upper dam structures has a rectangular prism shape having a length that is less than a corresponding length of the adjacent sidewall of the second semiconductor substrate.

13. A semiconductor package comprising:
a first semiconductor chip comprising a first semiconductor substrate having a first active layer, at least one first via electrode connected to the first active layer and penetrating through at least a portion of the first semiconductor substrate in a vertical direction; at least one first lower chip pad on a bottom surface of the first semiconductor substrate; and at least one first upper chip pad on a top surface of the first semiconductor substrate and connected to the at least one first via electrode;
a lower dam structure on an edge of the top surface of the first semiconductor substrate and comprising a plurality of lower dam protrusions spaced apart from one another;
a second semiconductor chip mounted to the first semiconductor chip, the second semiconductor chip comprising a second semiconductor substrate having a second active layer, and at least one second lower chip pad on a bottom surface of the second semiconductor substrate;
an upper dam structure on an edge of the bottom surface of the second semiconductor substrate and comprising a plurality of upper dam protrusions spaced apart from one another;
at least one chip connecting terminal electrically connecting the at least one first upper chip pad of the first semiconductor chip and the at least one second lower chip pad of the second semiconductor chip; and
an adhesive layer between the first semiconductor chip and the second semiconductor chip, the adhesive layer surrounding the at least one first upper chip pad, the at least one second lower chip pad, and the at least one chip connecting terminal,
wherein the adhesive layer is included in a space between an upper surface of the lower dam structure and a lower surface of the upper dam structure.

14. The semiconductor package of claim 13, wherein
the top surface of the first semiconductor substrate comprises
a first center portion on which the at least one first upper chip pad is disposed,
a first edge portion between the first center portion and sidewalls of the first semiconductor substrate and on which the lower dam structure is disposed, and
a first corner portion outside the first center portion and adjacent to vertices where a plurality of the sidewalls of the first semiconductor substrate meet one another;
wherein the bottom surface of the second semiconductor substrate comprises
a second center portion on which the at least one second lower chip pad is disposed,
a second edge portion between the second center portion and sidewalls of the second semiconductor substrate and on which the upper dam structure is disposed, and
a second corner portion outside the second center portion and adjacent to a vertex where a plurality of the sidewalls of the second semiconductor substrate meet;
wherein the adhesive layer comprises
a first adhesive portion between the first center portion of the first semiconductor substrate and the second center portion of the second semiconductor substrate,
a second adhesive portion between the first edge portion of the first semiconductor substrate and the second edge portion of the second semiconductor substrate and protruding from the sidewalls of the first semiconductor substrate, and
a third adhesive portion disposed between the first corner portion of the first semiconductor substrate and the second corner portion of the second semiconductor substrate and protruding from the vertices of the first semiconductor substrate; and wherein a distance of the third adhesive portion that protrudes from a closest one of the vertices of the first semiconductor substrate is greater than a distance of the second adhesive portion that protrudes from a closest one of the sidewalls of the first semiconductor substrate.

15. The semiconductor package of claim 13, wherein
a length of the lower dam protrusions in the vertical direction is within a range of 3 micrometers to 50 micrometers, and
a length of the upper dam protrusions in the vertical direction is greater than the length of the lower dam protrusions in the vertical direction and within a range of 10 micrometers to 100 micrometers.

16. The semiconductor package of claim 13, wherein
an interval between the upper dam protrusions is within a range of 5 micrometers to 300 micrometers, and
an interval between the lower dam protrusions is within a range of 5 micrometers to 300 micrometers.

17. The semiconductor package of claim 13, wherein the lower dam protrusions and the upper dam protrusions each comprise at least one of copper (Cu) or a photo imageable dielectric (PID) material.

18. The semiconductor package of claim 17, wherein a material constituting the upper dam protrusions is the same as a material constituting the second lower chip pad, and
a length of the upper dam protrusions in the vertical direction is identical to a length of the second lower chip pad of the second semiconductor chip in the vertical direction.

19. A semiconductor package comprising:
a package substrate;
a first semiconductor chip mounted to the package substrate, the first semiconductor chip comprising a first semiconductor substrate having a first active layer, at least one first via electrode connected to the first active layer and penetrating through at least a portion of the first semiconductor substrate in a vertical direction, at least one first lower chip pad on a bottom surface of the first semiconductor substrate, and at least one first upper chip pad on a top surface of the first semiconductor substrate and connected to the at least one first via electrode;
at least one package connection terminal between the package substrate and the at least one first lower chip pad of the first semiconductor chip;
an underfill layer between the package substrate and the first semiconductor chip and surrounding the at least one package connection terminal;
a lower dam structure on an edge of the top surface of the first semiconductor substrate;
a second semiconductor chip mounted to the first semiconductor chip, the second semiconductor chip comprising a second semiconductor substrate having a second active layer, and at least one second lower chip pad on a bottom surface of the second semiconductor substrate;
an upper dam structure on an edge of the bottom surface of the second semiconductor substrate;
at least one chip connecting terminal electrically connecting the at least one first upper chip pad of the first semiconductor chip and the at least one second lower chip pad of the second semiconductor chip;
an adhesive layer between the first semiconductor chip and the second semiconductor chip and surrounding the at least one first upper chip pad, the at least one second lower chip pad, and the at least one chip connecting terminal; and
a molding layer on the package substrate and surrounding the first semiconductor chip, the second semiconductor chip, and the adhesive layer,
wherein the adhesive layer is included in a space between an upper surface of the lower dam structure and a lower surface of the upper dam structure.

20. The semiconductor package of claim 19, wherein
the top surface of the first semiconductor substrate comprises
a first center portion on which the at least one first upper chip pad is disposed,
a first edge portion between the first center portion and sidewalls of the first semiconductor substrate and on which the lower dam structure is disposed, and
a first corner portion outside the first center portion and adjacent to vertices where a plurality of the sidewalls of the first semiconductor substrate meet one another;
wherein the bottom surface of the second semiconductor substrate comprises
a second center portion on which the second lower chip pad is disposed,
a second edge portion between the second center portion and sidewalls of the second semiconductor substrate and on which the upper dam structure is disposed, and
a second corner portion outside the second center portion and adjacent to a vertex where a plurality of the sidewalls of the second semiconductor substrate meet;
wherein the adhesive layer comprises
a first adhesive portion between the first center portion of the first semiconductor substrate and the second center portion of the second semiconductor substrate,
a second adhesive portion between the first edge portion of the first semiconductor substrate and the second edge portion of the second semiconductor substrate and protruding from the sidewalls of the first semiconductor substrate, and
a third adhesive portion disposed the first corner portion of the first semiconductor substrate and the second corner portion of the second semiconductor substrate and protruding from the vertices of the first semiconductor substrate; and
wherein a distance of the third adhesive portion that protrudes from a closest one of the vertices of the first semiconductor substrate is greater than a distance of the second adhesive portion that protrudes from a closest one of the sidewalls of the first semiconductor substrate.

* * * * *